United States Patent
Iwatsubo et al.

(10) Patent No.: US 8,661,879 B2
(45) Date of Patent: Mar. 4, 2014

(54) METHOD FOR DESIGNING GOLF CLUB AND GOLF CLUB

(75) Inventors: Takuzo Iwatsubo, Suita (JP); Hiroshi Hasegawa, Kobe (JP); Masahide Onuki, Kobe (JP)

(73) Assignees: A School Corporation Kansai University, Suita-Shi (JP); SRI Sports Limited, Kobe (JP)

( * ) Notice: Subject to any disclaimer, the term of this patent is extended or adjusted under 35 U.S.C. 154(b) by 578 days.

(21) Appl. No.: 12/956,960

(22) Filed: Nov. 30, 2010

(65) Prior Publication Data

US 2011/0130214 A1     Jun. 2, 2011

(30) Foreign Application Priority Data

Dec. 1, 2009 (JP) ................................. 2009-273053

(51) Int. Cl.
 *G01M 1/00* (2006.01)
(52) U.S. Cl.
 USPC .......................................... 73/65.01
(58) Field of Classification Search
 USPC .................... 73/65.01, 65.03, 65.07
 See application file for complete search history.

(56) References Cited

U.S. PATENT DOCUMENTS 5,772,522 A * 6/1998 Nesbit et al. .................. 473/222
5,826,578 A * 10/1998 Curchod ....................... 600/595
7,871,333 B1 * 1/2011 Davenport et al. ........... 473/223
2006/0040765 A1 2/2006 Sano
2009/0005188 A1 1/2009 Iwatsubo et al.

FOREIGN PATENT DOCUMENTS

| JP | 04-239976 A | 8/1992 |
|----|-------------|--------|
| JP | 2004-242855 A | 9/2004 |
| JP | 2006-81891 A | 3/2006 |
| JP | 2006-191949 A | 7/2006 |
| JP | 2006-218080 A | 8/2006 |
| JP | 2007-307353 A | 11/2007 |
| JP | 2009-5760 A | 1/2009 |

OTHER PUBLICATIONS

The Japan Society of Mechnical Engineers; A7 Dynamics of putter club and its application appeared in a collective treatise of symposium on sports engineering and symposium on human dynamics 2007; Takuzo Iwatsubo; pp. 35-40.

* cited by examiner

*Primary Examiner* — Max Noori
(74) *Attorney, Agent, or Firm* — Birch, Stewart, Kolasch & Birch, LLP

(57) ABSTRACT

A designing method of the present invention includes the steps of: measuring a golf swing to obtain a measured result; obtaining a swing model provided with a link model and joint torque data based on the measured result, the link model having at least two links; performing simulation for swing the golf club using the swing model; and obtaining head information in a specific situation during a swing based on a result of the simulation. In the designing method, a plurality of specifications of the golf club and/or the plurality of swing models are used to obtain the plurality of head information, and stability is evaluated using a difference between the head information. In the designing method, it was found that a great lateral moment of inertia of a head and a small depth of a center of gravity of the head contribute to the stability.

15 Claims, 16 Drawing Sheets

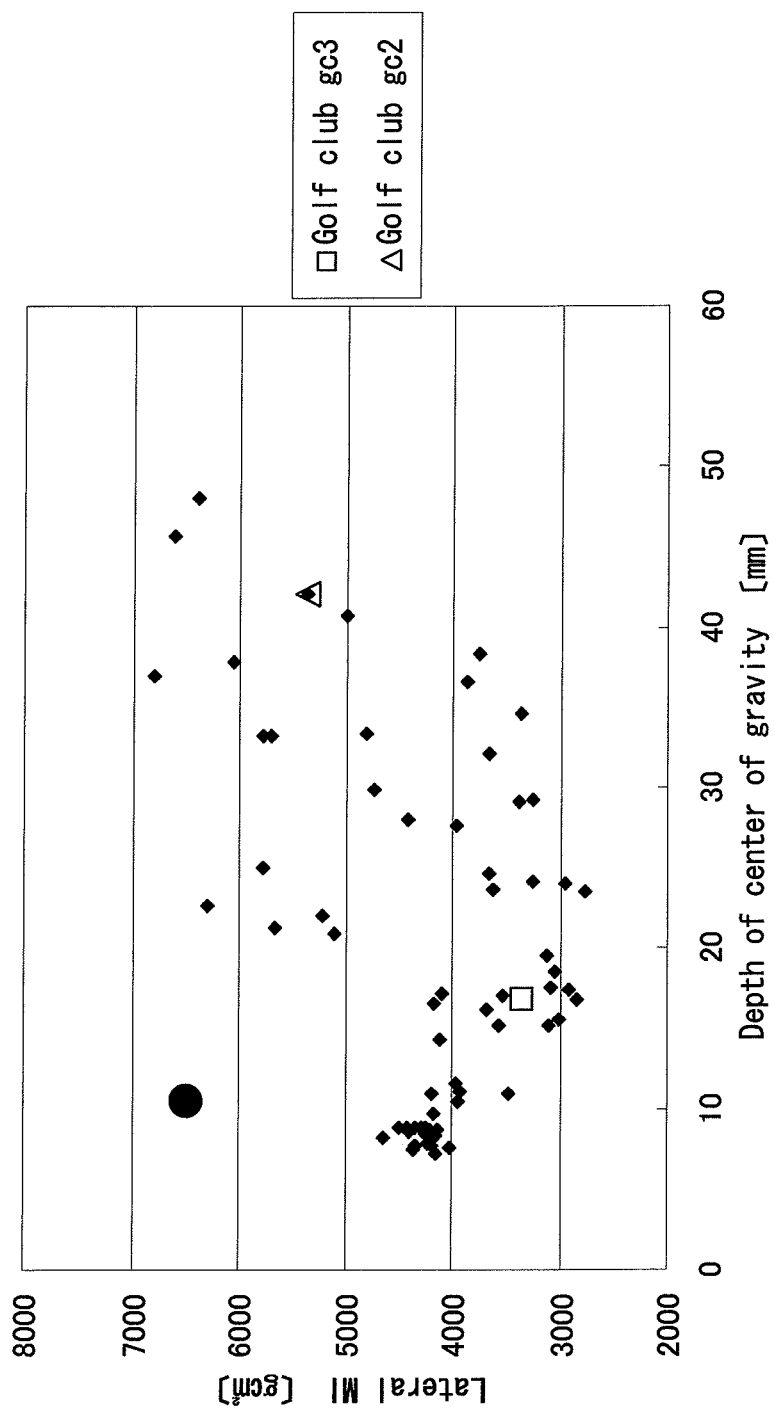

METHOD FOR DESIGNING GOLF CLUB AND GOLF CLUB

The application claims priority on Patent Application No. 2009-273053 filed in JAPAN on Dec. 1, 2009, the entire contents of which are hereby incorporated by reference.

BACKGROUND OF THE INVENTION

1. Field of the Invention

The present invention relates to a method for designing a golf club and a golf club.

2. Description of the Related Art

Attention is directed to increase of a distance and matching of a golf player and a golf club or the like in development of the golf club. Studies using simulation have been also made.

In Japanese Patent Application Laid-Open No. 2004-242855, torque acting on a shoulder joint based on an actual measured value is measured, and a swing is simulated using the torque. The simulation can accurately analyze the behavior of the golf club during the swing.

In Japanese Patent Application Laid-Open No. 2009-5760 (US2009/005188), torque applied to a golf club from a golf player during a swing is analyzed in time series. The analysis is applied to swing diagnosis, club selection and club design. The analysis uses a link model.

SUMMARY OF THE INVENTION

Even for a skilled golf player, it is difficult to always perform a perfect shot. The golf player practices in order to obtain a stable swing.

On the other hand, it is preferable that the golf club can stabilize a hitting ball result.

A technique for increasing a lateral moment of inertia is known in respect of suppressing deviation of a hitting ball in right and left directions when the ball is hit in a position separated from a center of gravity (sweet spot) of a head. Japanese Patent Application Laid-Open No. 2007-307353 discloses a putter having a great lateral moment of inertia. The putter extends backward long. In the putter, distribution of a weight is biased to a back part of a head.

The present inventors have examined a golf club providing a stabilized result. As a result, the inventors have conceived a novel technical thought of presuming a highly stable golf club using simulation.

It is an object of the present to provide a method for designing a highly stable golf club using simulation.

A designing method of the present invention includes the steps of: measuring a golf swing to obtain a measured result; obtaining a swing model provided with a link model and joint torque data based on the measured result, the link model having at least two links; performing simulation for swing the golf club using the swing model; and obtaining head information in a specific situation during a swing based on a result of the simulation. The link model includes a link corresponding to a part of a swing subject and a link corresponding to at least a part of the golf club. In the designing method, a plurality of specifications of the golf club and/or the plurality of swing models are used to obtain the plurality of head information, and stability is evaluated based on the head information.

The plurality of specifications of the golf club may be used to obtain the plurality of head information, and the stability may be evaluated based on sensitivity obtained by dividing a difference between the head information by a difference between the specifications.

Preferably, a part of the swing subject is a region between a neck part of a human body and a hand part thereof.

Preferably, the head information is a head speed, a locus of head, a hitting point or a face angle. Preferably, the specific situation is immediately before impact.

Preferably, the specifications are a position of a center of gravity of a head and/or a moment of inertia of the head.

A golf club according to the present invention is designed by any one of the designing methods.

In a preferable golf club, a position of a center of gravity of a head and/or a moment of inertia of the head are designed by the designing method.

Preferably, a lateral moment of inertia of the head is equal to or greater than 5000 g·cm$^2$; and a depth of a center of gravity of the head is equal to or less than 18 nun.

Another golf club according to the present invention includes a head; a shaft; and a grip, wherein a lateral moment of inertia of the head is equal to or greater than 5000 g·cm$^2$, and a depth of a center of gravity of the head is equal to or less than 18 mm. Preferably, the golf club is a putter golf club.

BRIEF DESCRIPTION OF THE DRAWINGS

FIG. 16 is a graph showing specifications of producible heads.

DESCRIPTION OF THE PREFERRED EMBODIMENTS

The present invention will be described below in detail based on preferred embodiments with reference to the drawings.

Figure 1:
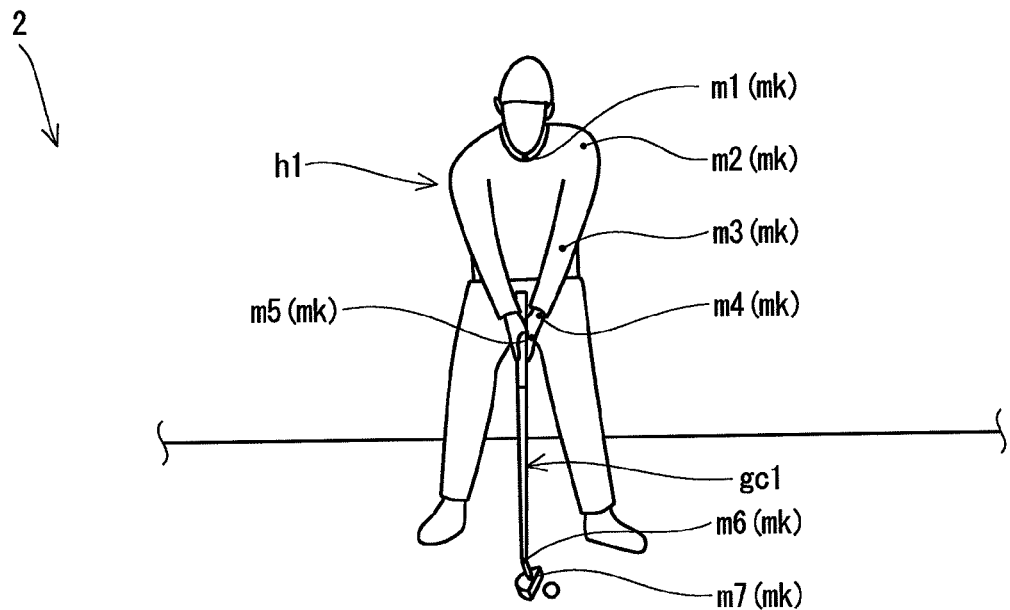
FIG. 1 is a view showing a condition of measurement according to an embodiment of the present invention.
Figure 1:
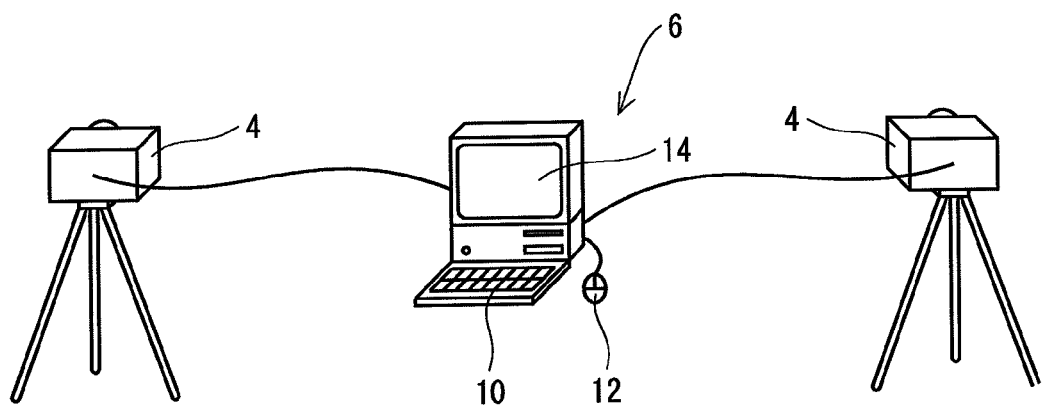

In this embodiment, a swing is measured in order to determine a swing model (see FIG. 1).

An object of the measurement is a human body h1 swinging a golf club gc1. In respect of obtaining a head behavior at impact, at least a swing before and after the impact is preferably measured. More preferably, at least a swing from a downswing to a follow-through is measured. Still more preferably, at least a swing from an address to the follow-through is measured.

As a swing subject, a swing robot is exemplified in addition to the human body h1. The swing subject can be selected based on evaluation purposes or the like.

The golf club gc1 in the measurement is not limited. In the embodiment, the golf club gc1 is a putter. Motion of the human body h1 in a swing in the putter is less than that of a usual shot. In the swing in the putter, a link model having a comparatively small number of links enables high-precision simulation.

The golf club gc1 may be a so-called wood club and iron club or the like. When the swing using these clubs is measured, a link model suitable for the swing can be employed.

In respect of enhancing precision of the simulation, a specification Sp1 of the golf club gc1 used in the measurement is preferably close to a specification Sp2 of the golf club inputted in the case of the simulation. In the respect, when simulation is performed in order to design a specific specification Spx, the specification Sp1 are preferably equal to the specification Sp2 except for the specification Spx which is a design object. The specification is each of data of a golf club inputted when performing the simulation.

In the measurement, behaviors of the human body h1 and the golf club gc1 during the swing are measured. In the measurement, three-dimensional coordinates of the human body h1 and the golf club gc1 during the swing are measured in time series. The three-dimensional coordinates are measured at a plurality of places so that a link model having at least two links can be constructed.

In the embodiment, a motion capture system is used as a swing measuring system 2. The motion capture system itself is known, and is commercially available. The motion capture system can measure the three-dimensional coordinate of a marker in time series. The motion capture system is an example of a three-dimensional operation analysis system. In the present invention, the three-dimensional operation analysis system is used.

Generally, the motion capture system measures the three-dimensional coordinate using a dynamic calibration technique or a static calibration technique based on the principle of triangulation. An optical type, a mechanical type, and a magnetic type or the like are known as a method of motion capture. Any of the types can be employed. A markerless motion capture which eliminates the use of the marker using an image processing technique may be used. When a golf swing is measured, an optical type motion capture system is preferable in respects of high precision and of hardly restraining a subject's swing. The motion capture system of the embodiment is an optical type.

The swing measuring system 2 has a plurality of cameras 4, a plurality of markers mk, and a data analysis device 6.

The number of the cameras 4 is not limited. At least two cameras 4 are used in respect of obtaining three-dimensional data. The plurality of cameras 4 is disposed at positions different from each other. Only two cameras 4 located in front of the human body h1 are shown in FIG. 1. However, in fact, the camera 4 is set also behind the human body h1. The cameras 4 are disposed so as to surround the human body h1. The cameras 4 are disposed so that the markers mk are photographed by at least two of the cameras 4 in all situations during the measurement.

When a large number of cameras 4 are used, the measurement precision can be enhanced. In these respects, the number of the cameras 4 is more preferably equal to or greater than 4, and still more preferably equal to or greater than 6. In respects of cost of a device and simplification of calculation, the number of the cameras 4 is preferably equal to or less than 20, more preferably equal to or less than 15, and still more preferably equal to or less than 10.

The kind of the camera 4 is not limited. An infrared camera, a color CCD camera, and a monochrome CCD camera are exemplified as the kind of the camera 4.

In respect of obtaining a still image of a swing moving at a high speed, a shutter speed is preferably short. Particularly preferably, the shutter speed is equal to or less than (1/500) second.

In the case of a short shutter speed, an amount of light is insufficient. When the CCD camera is used, a particularly bright light is required in order to secure a required amount of light. Even if the environment is dark and the shutter speed is short, the infrared camera can capture the markers mk. In this respect, the infrared camera is preferable. In this case, the markers mk having high infrared reflectance are preferably used.

The number of the markers mk applied to the golf club gc1 is not limited. In respect of constructing the link model including the golf club gc1, the marker mk is disposed at least one place on the golf club gc1. The marker mk is disposed at a place corresponding to the link model.

The number of the markers mk applied to the human body h1 is not limited. In respect of constructing the link model including a part of the human body h1, the marker mk is disposed at least one place on the human body h1. The marker mk is disposed at a place corresponding to the link model.

In the embodiment, a marker m1, a marker m2, a marker m3, a marker m4, a marker m5, a marker m6 and a marker m7 are disposed as the markers mk (see FIG. 1). The number and positions of the markers mk correspond to the link model (will be described later).

The shape and the size of the marker are not limited. The marker is, for example, a hemispherical object. The marker may have conspicuous colors such as white and a fluorescence color in order to facilitate image processing. In respect of reducing the influence to be exerted on the swing, the marker is preferably lightweight. For example, the marker is preferably made of foam polystyrene or the like. In FIG. 1, the markers mk are shown by filled circles.

The plurality of cameras 4 is connected to a computer 6. The computer 6 has a control part not shown. The control part controls the plurality of cameras 4 so as to enable synchronous photographing. The typical control part is a CPU. The computer 6 is provided with a storage part storing an analysis program for motion capture and an operation part. The analysis program is widely commercially available. The typical storage part is a hard disk. The typical operation part is a CPU. The computer 6 is further provided with a keyboard 10 and a mouse 12 as an input part, and a display 14 as a display part. Aside from the computer 6, an analysis computer for calculating a three-dimensional coordinate may be used. The computer 6 is a general-purpose computer.

Figure 2:
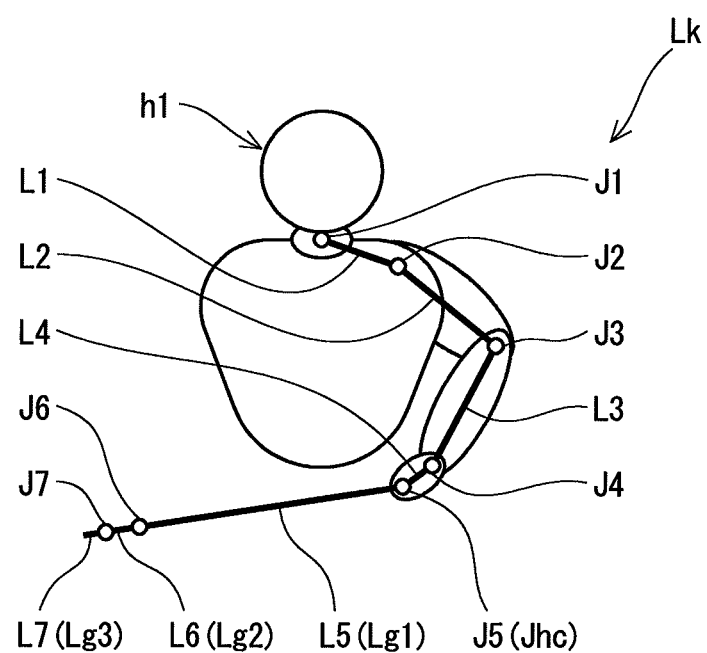
FIG. 2 is a view for explaining an example of a link model.
Figure 3:
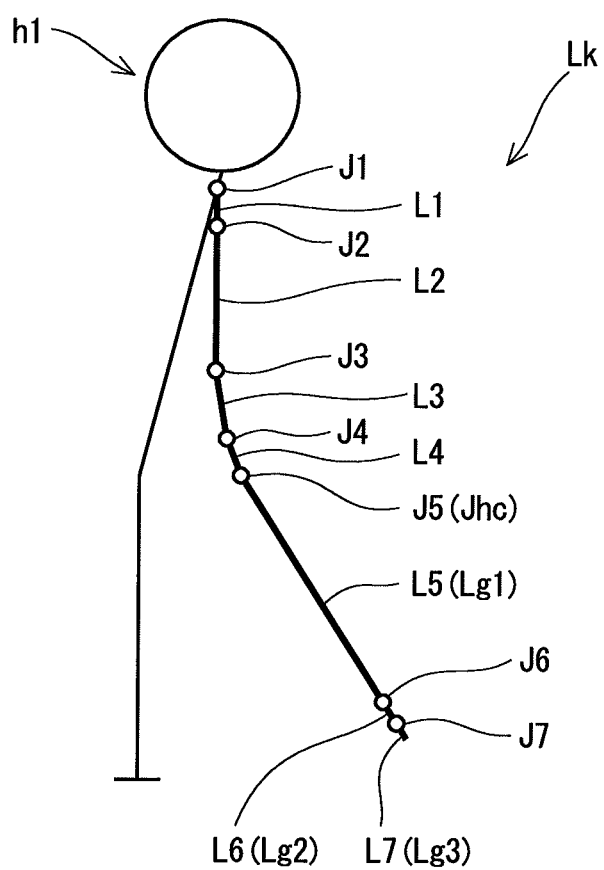
FIG. 3 is a view for explaining an example of a link model.

In the embodiment, the link model is used. FIGS. 2 and 3 are views for explaining the link model used for the embodiment. The state of the address is schematically shown in FIG. 3. A link model Lk includes a link corresponding to a part of the human body h1, and a link corresponding to at least a part of the golf club gc1. In the embodiment, the links corresponding to a part of the human body h1 are a link L1, a link L2, a link L3 and a link L4. In the embodiment, the links corresponding to at least a part of the golf club gc1 are a link L5, a link L6 and a link L7. The number of the links of the embodiment is 7. That is, the embodiment is a seven-link model.

A joint J1 is located at one end of the link L1. A joint J2 connects the link L1 to the link L2. A joint J3 connects the link L2 to the link L3.

A joint J4 connects the link L3 to the link L4. A joint J5 connects the link L4 to the link L5. A joint J6 connects the link L5 to the link L6. A joint J7 connects the link L6 to the link L7.

Each of the markers mk corresponds to each of the joints. The joint J1 corresponds to the marker m1. The joint J2 corresponds to the marker m2. The joint J3 corresponds to the marker m3. The joint J4 corresponds to the marker m4. The joint J5 corresponds to the marker m5. The joint J6 corresponds to the marker m6. The joint J7 corresponds to the marker m7.

The joint J1 corresponds to a neck of the human body h1. The joint J2 corresponds to a shoulder (left shoulder) of the human body h1. The joint J3 corresponds to an elbow (left elbow) of the human body h1. The joint J4 corresponds to a wrist (left wrist) of the human body h1. The joint J5 corresponds to a palm (left palm) of the human body h1.

Thus, a left side of the human body h1 is selected for the link model Lk. The left side of the human body h1 is selected because the human body h1 is a right-handed person. When the human body h1 is the right-handed person, the human body h1 tends to swing with the left side as a subject. Therefore, the selection of the left side of the human body h1 can suppress computational burdens and enhance precision of the simulation. Similarly, when the human body h1 is a left-handed person, a right side of the human body h1 is preferably selected for the link model Lk. The selection of only one side of the right and left sides suppresses the computational burdens.

A region of the human body h1 to which the link corresponds is not limited. A preferable part of the human body h1 is a region between a neck part of the human body h1 and a hand part thereof. Motion during the swing in the region between the neck part and the hand part is comparatively great. Therefore, the precision of the simulation can be enhanced by considering the region between the neck part and the hand part. On the other hand, motion during the swing in a region other than the region between the neck part and the hand part is comparatively small. Therefore, the computational burdens are reduced by excluding the region other than the region between the neck part and the hand part. Particularly, in the case of the swing in the putter, motion during the swing in the region other than the region between the neck part and the hand part is small. Therefore, particularly, in the case of the swing in the putter, a part of the human body h1 is preferably the region between the neck part and the hand part. When the computational burdens are considered, it is preferable that the link model Lk is not branched. In this respect, as in the embodiment, the Link model Lk in which only one side (left side or right side) of the human body h1 is considered is preferable.

In the embodiment, the number of the links corresponding to a part of the human body h1 is 4. At least one link corresponding to a part of the human body h1 is required. That is, the number of the links corresponding to a part of the human body h1 is equal to or greater than 1. The upper limit of the number of the links corresponding to a part of the human body h1 is not limited. When the computational burdens are considered, the number of the links corresponding to a part of the human body h1 is equal to or less than 5.

In the embodiment, the number of the links corresponding to at least a part of the golf club gc1 is 3. At least one link corresponding to at least a part of the golf club gc1 is required. When the golf club gc1 is not greatly deformed during the swing, A practical simulation result can be obtained even if the number of the links corresponding to at least a part of the golf club gc1 is 1. In the embodiment, the link L5 is a first link Lg1 corresponding to a part of the golf club gc1; the link L6 is a second link Lg2 corresponding to a part of the golf club gc1; and the link L7 is a third link Lg3 corresponding to a part of the golf club gc1. The link L5 corresponds to a second portion of a shaft. The link L6 corresponds to a first portion of the shaft. The link L7 corresponds to a head. The shaft of the golf club gc1 is bent. A long portion located on the grip side is the second portion of the shaft, with the bent portion as a boundary. A short portion located on the head side is the first portion of the shaft.

The link model Lk has a joint Jhc which connects the link L4 corresponding to the human body h1 to the link L5 corresponding to the golf club gc1. In the embodiment, the joint Jhc is the joint J5. The number of joints of the link model Lk is equal to or greater than 1. The link model Lk includes the joint Jhc. The number of the links of the link model Lk is equal to or greater than 2. As described above, particularly, the motion of the human body h1 in the swing in the putter is less than that of the usual shot. Therefore, in the swing in the putter, practical simulation can be obtained also by the small number of the links (for example, a two-link model).

A position of a center of gravity of the link (link L7) corresponding to the head is set to a position separated from a shaft axis (a central axis of the link L5). In the setting, an influence on stability by a position of a center of gravity of the head can be decided by the simulation.

Each of the links may be a rigid body. That is, the link model Lk may be a rigid body link model. Input and the computational burdens are reduced by the rigid body link model. The link model Lk may include a link which is not the rigid body. For example, the link corresponding to the shaft of the golf club gc1 may be modeled by a beam element. In this case, for example, an elastic modulus and a wall thickness or the like of the shaft are inputted into the link corresponding to the shaft.

In the link model Lk, the end joint J1 located on the human body h1 side is fixed. In the link model Lk, the joint J1, the joint J2, the joint J3, the joint J4 and the joint J5 are three-dimensional ball joints enabling free (nonresistant) motion. However, as will be described later, constraint of the motion is set for a specific joint. The constraint is set in consideration of the motion of the joint of the human body h1. A spring and/or a damper may be defined as the joint if needed.

In the embodiment, the golf club gc1 is divided into three links in consideration of the facility of the setting of a parameter. However, the joint J6 and the joint J7 are completely fixedly treated.

Figure 4:
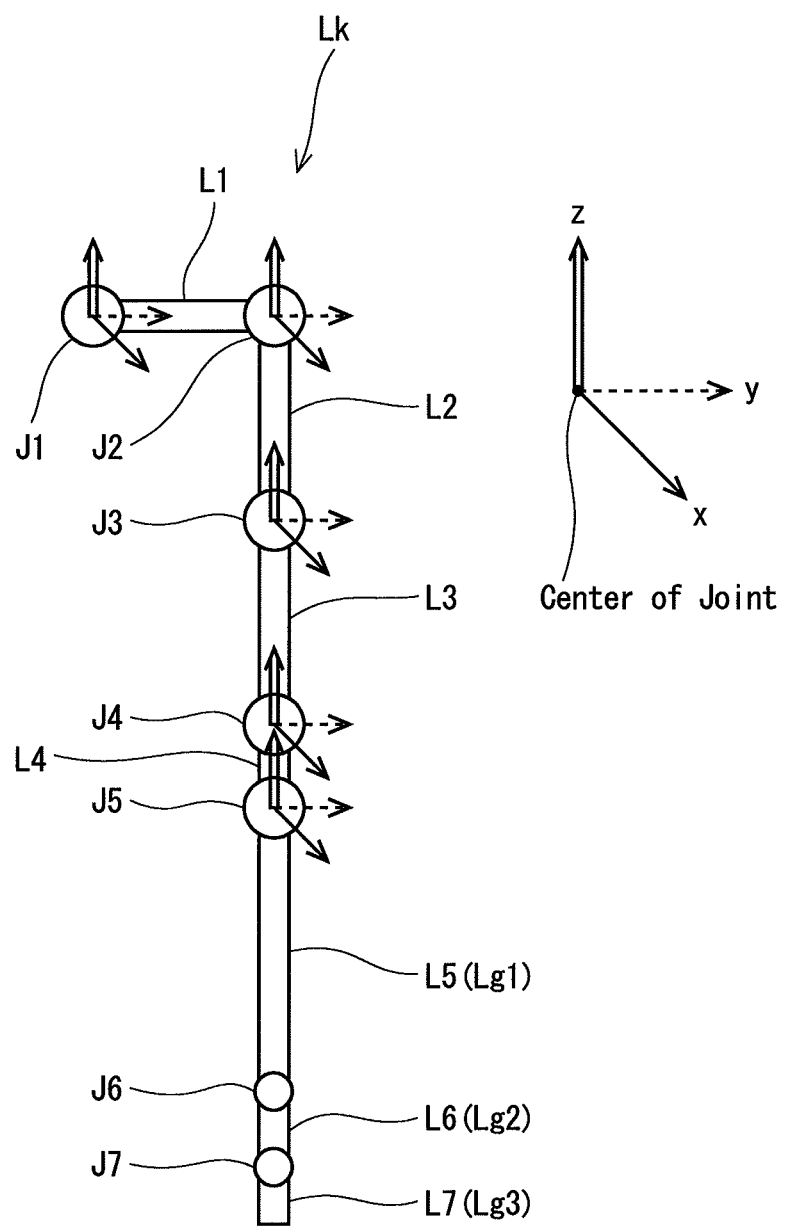
FIG. 4 is a view for explaining an example of a link model and a local coordinate system.
Figure 5:
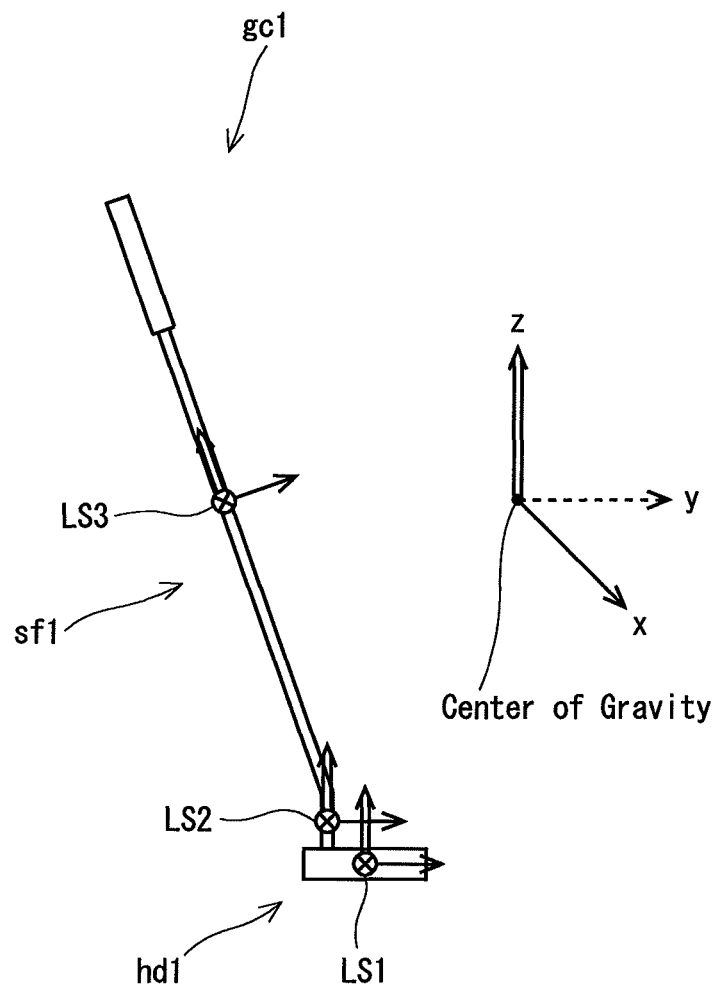
FIG. 5 is a view for explaining a local coordinate system related to a golf club.
Figure 6:
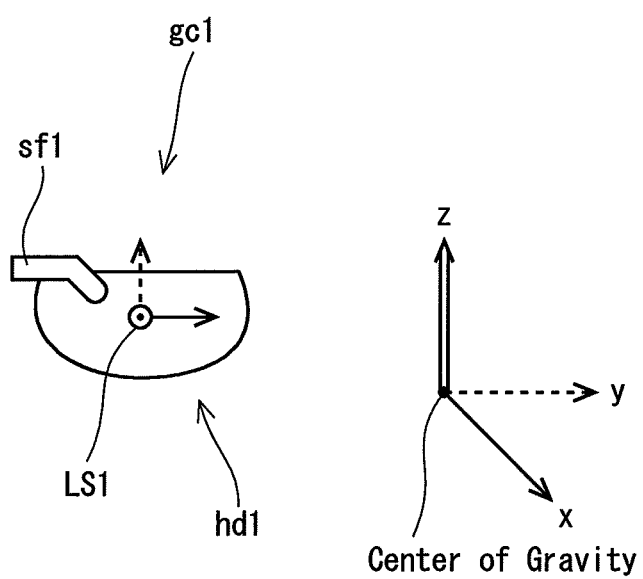
FIG. 6 is a view for explaining a local coordinate system related to a golf club.

FIG. 4 shows a local coordinate system required for analysis on the human body h1 side. FIGS. 5 and 6 show a local coordinate system required for analysis on the golf club gc1 side.

In the link model Lk, the local coordinate system is set in each of the joints for a portion corresponding to the human body h1. The local coordinate system is set for each of the joints J1 to J5 belonging to the human body h1. The local coordinate system has an x axis with the front side of the human body h1 as plus, a y axis with a swing direction as plus, and a z axis perpendicular to the x axis and the y axis, with the center of the joint as an original point (see FIG. 4). A vertical upper direction of the z axis is plus. The local coordinate system is an orthogonal coordinate system.

In the link model Lk, the local coordinate system is set for the portion corresponding to the golf club gc1 with the position of the center of gravity of each of parts (the first portion of the shaft, the second portion of the shaft and the head) as an original point. In a local coordinate system LS1 of the head, a direction parallel to a face surface is defined as an x axis; a direction perpendicular to the face surface is defined as a y axis; and a direction perpendicular to the x axis and the y axis is defined as a z axis. In the setting of the y axis, a real loft angle of the golf club gc1 is assumed to be 0 degree. In the z axis, the vertical upper direction is plus. In a local coordinate system LS2 of the first portion of the shaft, a direction parallel to the face surface is defined as an x axis; a direction perpendicular to the face surface is defined as a y axis; and an axial direction of the first portion of the shaft is defined as a z axis. In the setting of the y axis, a real loft angle of the golf club gc1 is assumed to be 0 degree. In the z axis, the vertical upper direction is plus. In a local coordinate system LS3 of the second portion of the shaft, a direction perpendicular to the face surface is defined as a y axis; an axial direction of the second portion of the shaft is defined as a z axis; and a direction perpendicular to the y axis and the z axis is defined as a x axis. In the x axis, a forward direction of the human body h1 is plus. In the z axis, a butt side (grip side) is plus. In the setting of the y axis, a real loft angle of the golf club gc1 is assumed to be 0 degree.

In the link model Lk of the embodiment, the joint J3 corresponding to the elbow is set so that the joint J3 cannot be rotated around the x axis. In the link model Lk of the embodiment, the joint J4 corresponding to the wrist is set so that the joint J4 cannot be rotated around the z axis. The constraints of the rotation are determined in consideration of the skeletal structure of the human body h1. In consideration of the characteristics of the joint of the human body h1, the precision of the simulation can be enhanced by constraining the rotation of the joint of the link model Lk.

Hereinafter, a procedure of a designing method of the embodiment will be described.

First, as described above, the swing of the human body h1 is measured (step 1). The time-series data of the three-dimensional coordinate of each of the markers mk are obtained by the measurement. The torque of each of the joints is calculated based on the data. The swing model provided with the link model having at least two links and joint torque data is obtained. In the embodiment, the swing model provided with the link model having seven links and the joint torque data is obtained. Inverse dynamic analysis is used for calculating joint torque. A method for calculating the joint torque is known as described also in Japanese Patent application Laid-Open No. 2009-5760 described above. The joint torque is calculated by commercially available analysis software.

Next, the simulation for swinging the golf club is performed by forward dynamic analysis using the swing model (step 2). In the simulation, a golf club having specifications different from those of the golf club used in the measurement can be used. The specifications desired to be designed are inputted and simulation is performed. The golf club having various specifications can be swung in the simulation by using the swing model.

Next, head information in a specific situation during the swing is obtained based on the result of the simulation (step 3). Examples of the head information include information related to a head position, information related to a head behavior and information related to a head posture.

The head position is, for example, a relative position with respect to a ball. A hitting point can be obtained based on the head position. The position of the head immediately before impact is substantially the same as that of the head immediately after the impact. Examples of the hitting point include a vertical directional hitting point and a toe-heel directional hitting point.

Examples of the information related to the head behavior include a head speed and a locus of head. Examples of the locus of head include a blow angle and a swing path angle. In the present application, the blow angle is the locus of head projected on a vertical plane, and corresponds to the locus of head generally referred to as down blow or upper blow or the like. In the present application, the swing path angle is an angle of the locus of head projected on a level plane, and corresponds to the locus of head generally referred to as outside-in or inside-out or the like. The swing path angle is, for example, an angle with respect to a target direction.

Examples of the information related to the head posture include a loft angle and a face angle. The loft angle is a loft angle with respect to a vertical line. The loft angle is not an angle with respect to the shaft axis, and is changed according to the posture of the head. The face angle is an angle of a face when the head is viewed from above, and determines the direction of the hitting ball.

A hitting ball result is strongly influenced by the head position, the head behavior, and the head posture at the moment of the impact. Therefore, the specific situation is preferably immediately before the impact. The term "immediately before impact" is preferably between 0.05 second before the impact and the impact, more preferably between 0.01 second before the impact and the impact, still more preferably between 0.005 second before the impact and the impact, and yet still more preferably between 0.003 second before the impact and the impact.

The data obtained by the measurement and the simulation is time-series. More particularly, the data is a set of data at fixed intervals. The interval of data is set by a measurement frequency. Data of a time closest to the impact can be sorted out from the set of the data. Data of a time T1 before the impact and closest to the impact is preferably used. That is, data immediately before the impact is preferably used.

The head position and the head posture can be decided by data of one time. Therefore, the information related to the head position and the information related to the head posture are preferably based on the data of the time T1. On the other hand, data of least two times are required for the head behavior. Therefore, the information related to the head behavior is preferably based on the data of the time T1 and data of a time T2 before the time T1 and closest to the time T1. That is, the data immediately before the impact is preferably used.

Next, the obtained data are analyzed to evaluate the stability of the golf club (step 4). The stability is decided based on a plurality of data obtained by the simulation. It can be decided that the smaller a difference between the plurality of data is, the higher the stability of the golf club gel is.

When the stability is decided, the difference between the data is treated as an absolute value. That is, when the difference is minus, the difference is treated as plus. It can be considered that "the smaller the difference is, the higher the stability is" by treating the difference as the absolute value. The "difference" in the present application is the "absolute value of the difference" except for the case the "difference" is particularly explained.

The data used for deciding the stability is the information related to the head. That is, the data used for deciding the stability is the hitting point, the locus of head, and the head posture or the like. A plurality of data can be obtained by performing simulation on a plurality of conditions. The stability can be decided by the plurality of data.

An example of the step (the step 4) of evaluating the stability is as follows. The simulation is first performed on a first condition to obtain the head information (for example, the face angle) (1) immediately before the impact. Then, the simulation is performed on a second condition to obtain the head information (for example, the face angle) (2) immediately before the impact. The head information (1) and head information (2) which are compared are the same kind (for example, the face angle). When a difference between the head information (1) and the head information (2) is small, it can be decided that the stability is high.

Thus, the plurality of head information is required in order to evaluate the stability. In order to obtain the plurality of head information, the simulation is performed on the plurality of conditions. That is, the plurality of head information is obtained by using the plurality of specifications and/or swing models of the golf club. The stability is evaluated using the difference between the head information.

Preferably, the plurality of head information is obtained by using the plurality of specifications of the golf club. The plurality of specifications (for example, the positions of the centers of gravity of the head or moments of inertia) to be designed is used, and thereby the stability of the head caused by the specifications can be decided. It can be decided whether the specification (the specification inputted in the simulation) is good based on the stability. As a preferable example in the case of the plurality of specifications, the plurality of head information is obtained by using the plurality of specifications and one swing model. Since only the specifications are fluctuated and the same swing model is used in the method, the stability can be decided without receiving the influence of fluctuation of the swing model. Therefore, the method is suitable for deciding the influence of the specification on the stability. Alternatively, the plurality of specifications and swing models may be used. In this case, since the plurality of swing models is used, the stability when the swing models are fluctuated can be evaluated. Therefore, for example, a specification suitable for a player having variance in a swing, or a specification suitable for many golf players and having high versatility can be designed.

The plurality of head information may be obtained by using the plurality of swing models and one specification. Also in this case, the stability when the swing models are fluctuated can be evaluated. However, when the relative stability is evaluated, it is necessary to obtain the other head information when the specification is fluctuated, and to compare the stabilities of the head information.

Specifically, in order to obtain the plurality of head information, for example, the designing method includes the following (Sim1) or (Sim2).

(Sim1): a step of inputting a plurality of club specifications into one swing model and a step of performing simulation for each of the specifications.

(Sim2): a step of inputting the plurality of club specifications into each of the plurality of swing models and a step of performing simulation for each of the swing models and each of the club specifications.

The case of the (Sim1) will be specifically described.

The plurality of club specifications is preferably the same kind. For example, the club specification is a position of a center of gravity of a head. For example, a first position of a center of gravity of a head, a second position of a center of gravity of a head, a third position of a center of gravity of a head, and a fourth position of a center of gravity of a head are set as the plurality of club specifications of the same kind. Assumed conditions herein are as follows.

The first position of the center of gravity of the head the second position of the center of gravity of the head are located in an area A.

The third position of the center of gravity of the head and the fourth position of the center of gravity of the head are located in an area B.

The first position of the center of gravity of the head and the second position of the center of gravity of the head are close to each other.

The third position of the center of gravity of the head and the fourth position of the center of gravity of the head are close to each other.

The area A is separated from the area B.

First, the first position of the center of gravity of the head is inputted into the swing model, and simulation is performed to obtain first head information. Next, the second position of the center of gravity of the head is inputted into the same swing model, and simulation is performed to obtain second head information. Next, the third position of the center of gravity of the head is inputted into the same swing model, and simulation is performed to obtain third head information. Next, the fourth position of the center of gravity of the head is inputted into the same swing model, and simulation is performed to obtain fourth head information.

Next, an absolute value Ab12 of a difference between the first head information and the second head information is calculated. An absolute value Ab34 of a difference between the third head information and the fourth head information is calculated. The absolute value Ab12 is compared with the absolute value Ab34. The stability can be estimated by the comparison. When the absolute value Ab12 is smaller than the absolute value Ab34, it can be decided that the position of the center of gravity of the head is better to be provided in not the area B but the area A. Thus, the position of the center of gravity of the head having high stability can be designed.

Next, the case of the (Sim2) will be specifically described.

The plurality of swing models is, for example, a first swing model based on a first swing of a golf player A and a second swing model based on a second swing of the same golf player A. For example, in swings (for example, putting) of the golf player A aiming at the same point (for example, a cup) from the same position, a swing providing a good result is defined as the first swing, and a swing providing a poor result is defined as the second swing.

For example, the first position of the center of gravity of the head and the second position of the center of gravity of the head are assumed as the plurality of club specifications.

First, the first position of the center of gravity of the head is inputted into the first swing model, and simulation is performed to obtain head information (11). Next, the first position of the center of gravity of the head is inputted into the second swing model, and simulation is performed to obtain head information (21). Next, the second position of the center of gravity of the head is inputted into the first swing model, and simulation is performed to obtain head information (12). Next, the second position of the center of gravity of the head is inputted into the second swing model, and simulation is performed to obtain head information (22).

Next, an absolute value Abx of a difference between the head information (11) and the head information (21) is calculated. An absolute value Aby of a difference between the head information (12) and the head information (22) is calculated. Then, the absolute value Abx is compared with the absolute value Aby. The stability can be estimated by the comparison. When the absolute value Abx is smaller than the absolute value Aby, the first position of the center of gravity of the head can be presumed to have stability higher than that of the second position of the center of gravity of the head. Thus, the position of the center of gravity of the head having high stability can be designed.

The plurality of swing models may be the first swing model based on the swing of the golf player A and a second swing model based on a swing of another golf player B. In this case, the design of the golf club having high versatility can be achieved.

An example of a designing method related to the (Sim1) includes the steps of: measuring a golf swing (1) to obtain a measured result (1); obtaining a swing model (1) provided with a link model having at least two links and joint torque data based on the measured result (1); performing simulation (1) for swinging a golf club (1) using the swing model (1); obtaining head information (1) of the golf club (1) in a specific situation during a swing based on a result of the simulation (1); performing simulation (2) for swinging a golf club (2) using the swing model (1); obtaining head information (2) of the golf club (2) in a specific situation during a swing based on a result of the simulation (2); and evaluating stability using the head information (1) and the head information (2).

An example of a designing method related to the (Sim2) includes the steps of: measuring a golf swing (1) to obtain a measured result (1); obtaining a swing model (1) provided with a link model having at least two links and joint torque data based on the measured result (1); performing simulation (11) for swinging a golf club (1) using the swing model (1); obtaining head information (11) of the golf club (1) in a specific situation during a swing based on a result of the simulation (11); measuring a golf swing (2) to obtain a measured result (2); obtaining a swing model (2) provided with a link model having at least two links and joint torque data based on the measured result (2); performing simulation (21) for swinging the golf club (1) using the swing model (2); obtaining head information (21) of the golf club (1) in a specific situation during a swing based on a result of the simulation (21); measuring a golf swing (1) to obtain a measured result (1); obtaining a swing model (1) provided with a link model having at least two links and joint torque data based on the measured result (1); performing simulation (12) for swinging a golf club (2) using the swing model (1); obtaining head information (12) of the golf club (2) in a specific situation during a swing based on a result of the simulation (12); measuring a golf swing (2) to obtain a measured result (2); obtaining a swing model (2) provided with a link model having at least two links and joint torque data based on the measured result (2); performing simulation (22) for swinging the golf club (2) using the swing model (2); obtaining head information (22) of the golf club (2) in a specific situation during a swing based on a result of the simulation (22); and evaluating stability using the head information (11), the head information (21), the head information (12), and the head information (22).

Sensitivity can be also used in addition to the difference between the head information in order to evaluate the stability. The sensitivity is calculated based on the head information. The sensitivity is obtained by dividing the difference between the head information by the difference between the specifications. That is, the sensitivity is the difference between the head information per one unit of the difference between the specifications. The precision of the evaluation of the stability can be enhanced by using the "sensitivity". All calculations using the head information can be applied to the evaluation of the stability. The specific example of the sensitivity will be shown in examples which will be described later.

EXAMPLES

Hereinafter, the effects of the present invention will be clarified by examples. However, the present invention should not be interpreted in a limited way based on the description of the examples.

Figure 7:
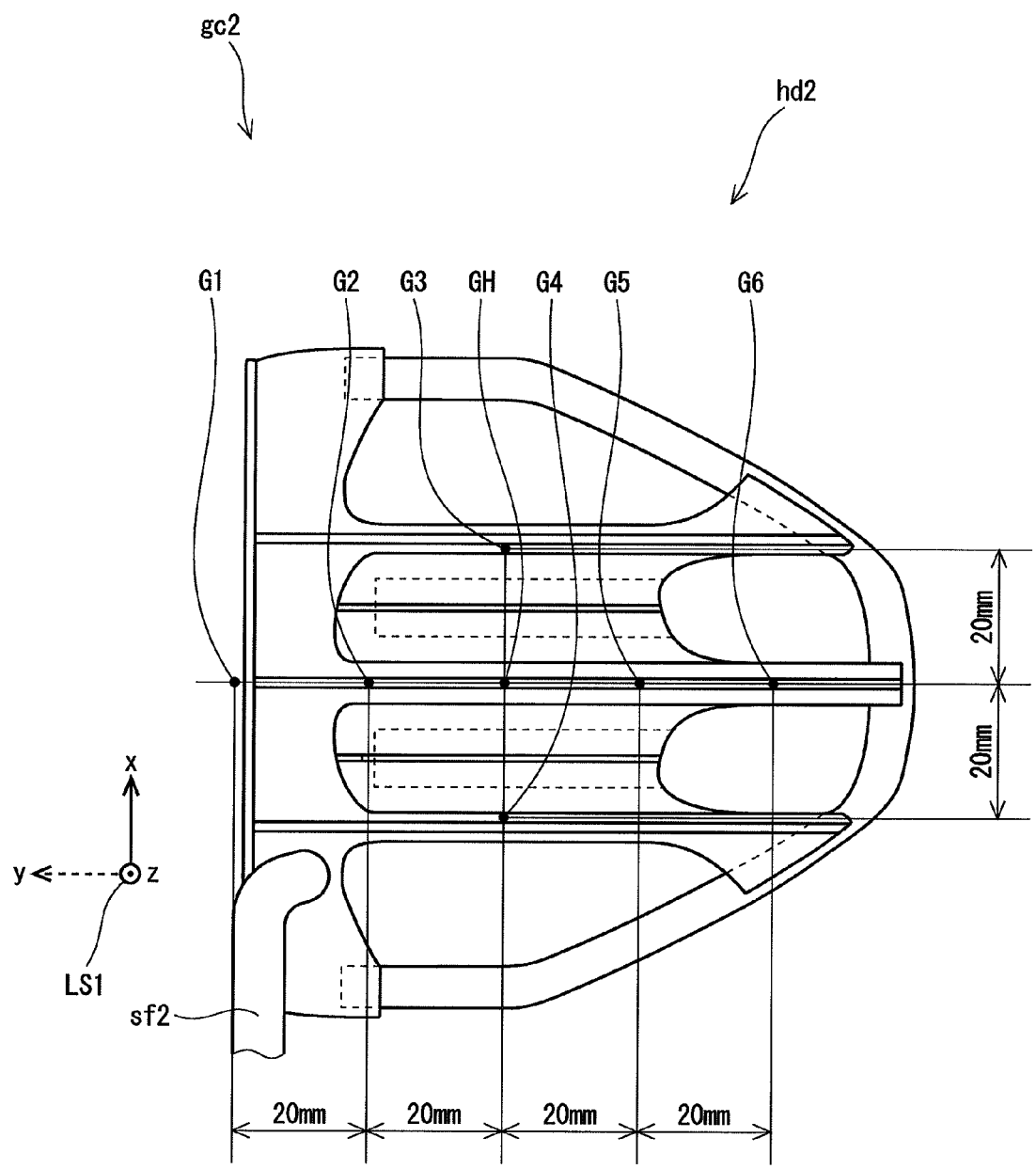
FIG. 7 is a view showing an example of a head according to the present invention, and shows a plurality of positions of centers of gravity of the head of a club swung by simulation.
Figure 11:
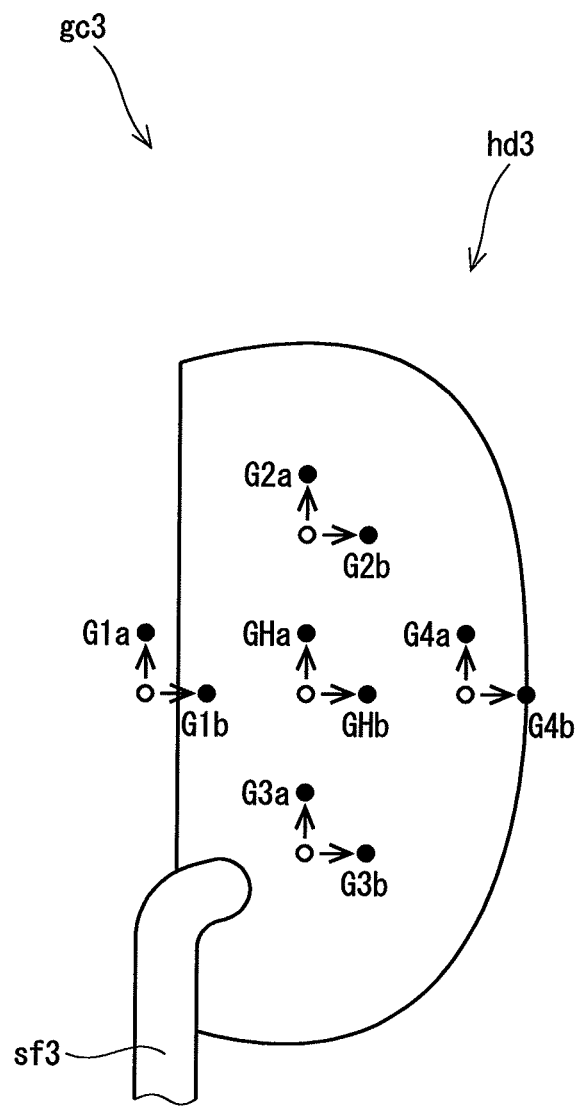
FIG. 11 is a view showing another example of a head according to the present invention, and shows a plurality of positions of centers of gravity of the head of a club swung by simulation.

A golf club gc2 having a head hd2 shown in FIG. 7 and a golf club gc3 having a head hd3 shown in FIG. 11 were used. The golf club gc2 is the same as the golf club gc1 except for the shape of the head. The golf club gc3 is the same as the golf club gc1 except for the shape of the head.

The golf club gc2 is a putter. The specifications of the putter are shown in the following Table 1.

TABLE 1

| | Specifications of golf club gc2 (putter) | | | | | | | | |
|---|---|---|---|---|---|---|---|---|---|
| | Weight (g) [g] | Depth of center of gravity [mm] | Position of center of gravity [mm] | Ixx [$gcm^2$] | Iyy [$gcm^2$] | Izz [$gcm^2$] | Ixy [$gcm^2$] | Ixz [$gcm^2$] | Iyz [$gcm^2$] |
| Head | 342.46 | 42.11 | — | 3021.83 | 2604.49 | 5372.96 | 29.39 | 2.81 | −51.68 |
| First portion of shaft | 12.24 | — | 779.97 | 109.08 | 106.86 | 4.73 | 0.22 | 1.95 | 15.11 |
| Second portion of shaft | 167.35 | — | 262.73 | 76156.43 | 76169.46 | 108.99 | 1.42 | −119.60 | −12.92 |

The golf club gc3 is a putter. The specifications of the putter are shown in the next Table 2.

TABLE 2

| | Specifications of golf club gc3 (putter) | | | | | | | | |
|---|---|---|---|---|---|---|---|---|---|
| | Weight (g) [g] | Depth of center of gravity [mm] | Position of center of gravity [mm] | Ixx [$gcm^2$] | Iyy [$gcm^2$] | Izz [$gcm^2$] | Ixy [$gcm^2$] | Ixz [$gcm^2$] | Iyz [$gcm^2$] |
| Head | 333.32 | 16.89 | — | 625.30 | 3152.02 | 3348.87 | −100.57 | −58.42 | 145.09 |
| First portion of shaft | 10.19 | — | 791.17 | 62.64 | 61.49 | 3.24 | 0.10 | 1.00 | 8.22 |
| Second portion of shaft | 167.90 | — | 264.31 | 77136.23 | 77149.48 | 109.11 | 0.30 | −112.99 | −4.30 |

In Tables 1 and 2, a depth of a center of gravity is a distance between a front end (leading edge) of a head and a center of gravity of the head. A position of a center of gravity of a first portion of a shaft is a distance from a back end of a club. A position of a center of gravity of a second portion of the shaft is also a distance from the back end of the club. A weight and a position of a center of gravity of the second portion of the shaft are measured including a grip.

In Tables 1 and 2, Ixx is a moment of inertia around an x axis; Iyy is a moment of inertia around a y axis; and Izz is a moment of inertia around a z axis. Ixy is a product of inertia related to the x axis and the y axis; Ixz is a product of inertia related to the x axis and the z axis; and Iyz is a product of inertia related to the y axis and the z axis. The moments of inertia and the products of inertia are values in the local coordinate system (see FIG. 5) described above.

Example 1

A golf player A performed patting using the golf club gc2. The golf player A performed patting (swing using a putter) so as to target a specific target (cup) from a specific point. A distance between the point and the cup was set to 10 m. The patting was measured by a swing measuring system.

Measurement was performed at five times. First swing data 1 and second swing data 2 were recorded. The swing data 1 is swing data providing the best result. The swing data 2 is swing data providing the worst result.

A measuring method and an analyzing method were the same as those in the embodiment described above. "MX-F40" (trade name) manufactured by Vicon Corporation was used as a camera for photographing a swing. The number of cameras was set to 8. A swing from an address to a follow-through was photographed (measured) at 500 fps. The term "fps" stands for "Frame Per Second".

The data were analyzed based on the measured results. The specifications of the golf club described above were inputted before the analysis. The same seven-link model as that in the embodiment described above was used as a link model. "VICON MX iQ2.5" (trade name) manufactured by Vicon Corporation was used as analysis software. A joint angle in each of joints was calculated in time series by the analysis. Joint torque was calculated by inverse dynamic analysis using the time-series data of the joint angle. As a result, a swing model 1 based on the swing data 1 and a swing model 2 based on the swing data 2 were obtained.

Next, stability was evaluated using a plurality of club specifications. In the example, positions G1, G2, G3, G4, G5, G6, and GH of centers of gravity of seven heads were employed as the plurality of club specifications. The positions of the centers of gravity of the heads are shown in FIG. 7.

In the evaluation of the stability, a swing model G11 and a swing model G12 for evaluating the position G1 of the center of gravity of the head were first made.

The swing model G11 is a swing model obtained by changing the position of the center of gravity of the head to the position G1 of the center of gravity of the head from an actual measured value under a condition where the motion of the link model during the swing was made completely the same as that of the swing model 1. That is, the swing model G11 is a swing model provided with joint torque data obtained by using the swing data 1, inputting the specifications of the golf club in which the position of the center of gravity of the head was changed to G1, and calculating using inverse dynamic analysis. In the swing model G11, a value of torque in each of joints is different from that in the swing model 1.

The swing model G12 is a swing model obtained by changing the position of the center of gravity of the head to the position G1 of the center of gravity of the head from an actual measured value under a condition where the motion of the link model during the swing was made completely the same as that of the swing model 2. That is, the swing model G12 is a swing model provided with joint torque data obtained by using the swing data 2, inputting the specifications of the golf club in which the position of the center of gravity of the head was changed to G1, and calculating using inverse dynamic analysis. In the swing model G12, a value of torque in each of joints is different from that in the swing model 2.

Similarly, swing models for evaluating the other positions G2 to G6 and GH of the centers of gravity were made.

Figure 8:
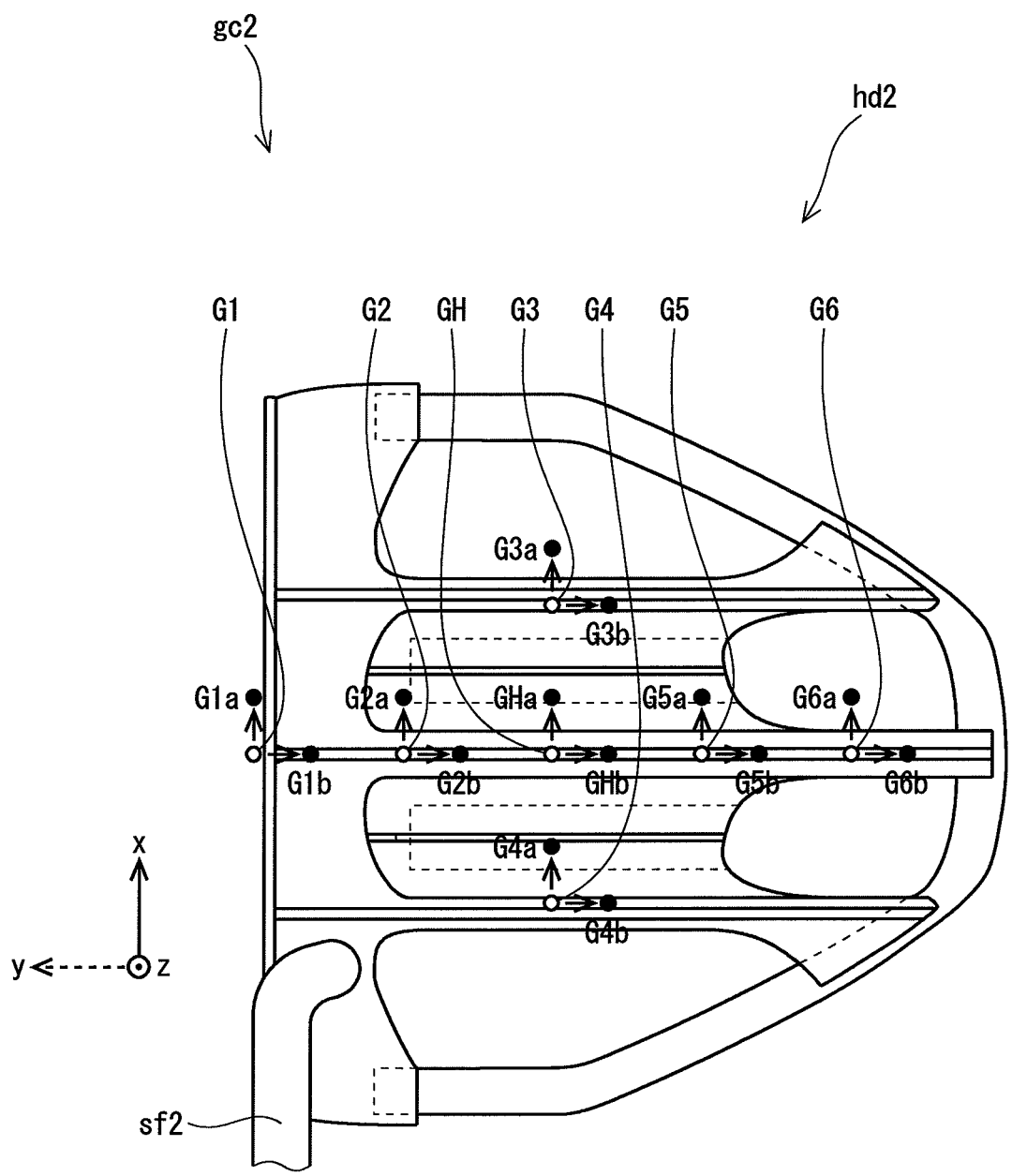
FIG. 8 is a view for explaining motion of a minute distance.
Figure 9:
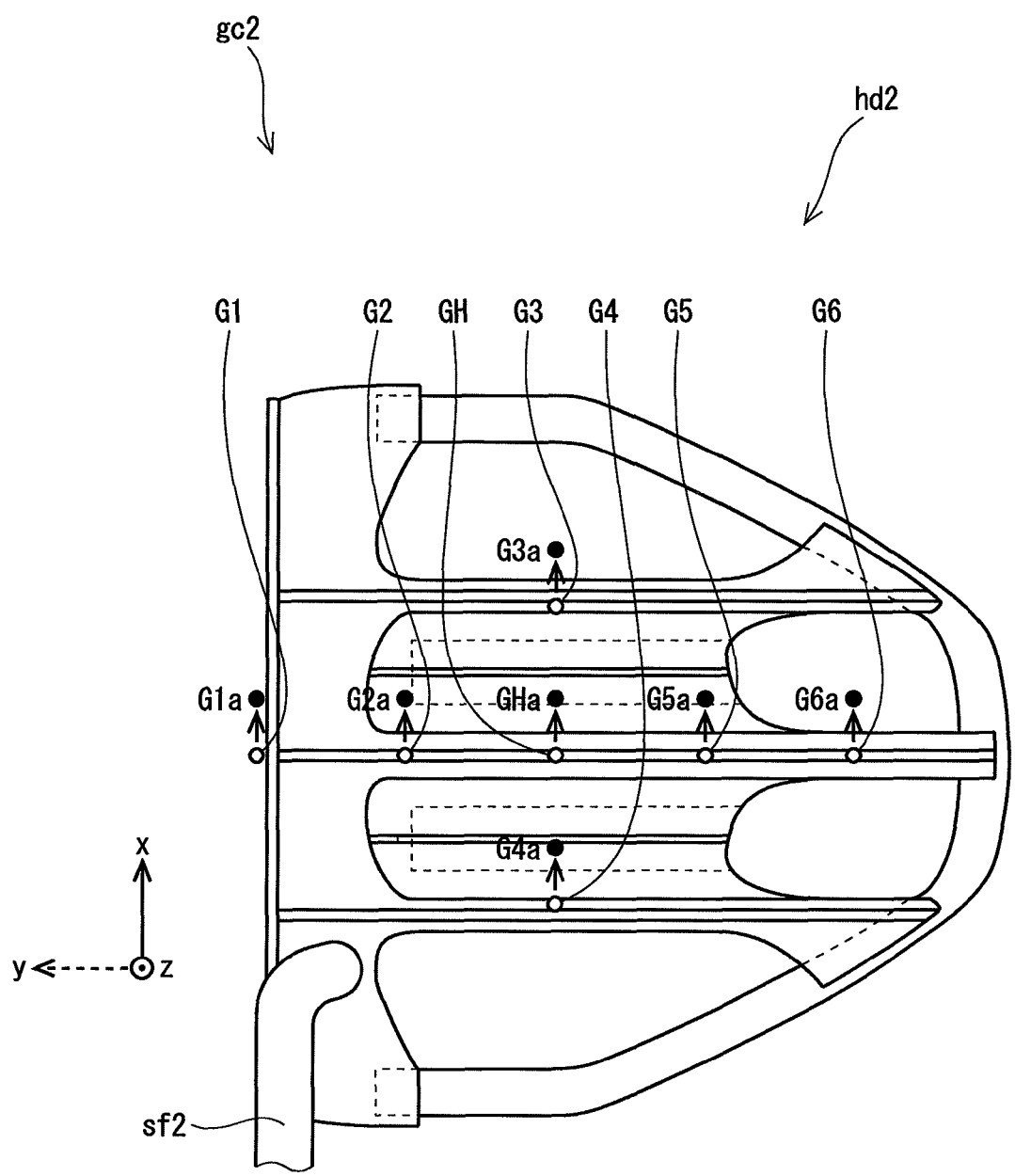
FIG. 9 is a view for explaining motion of a minute distance.
Figure 10:
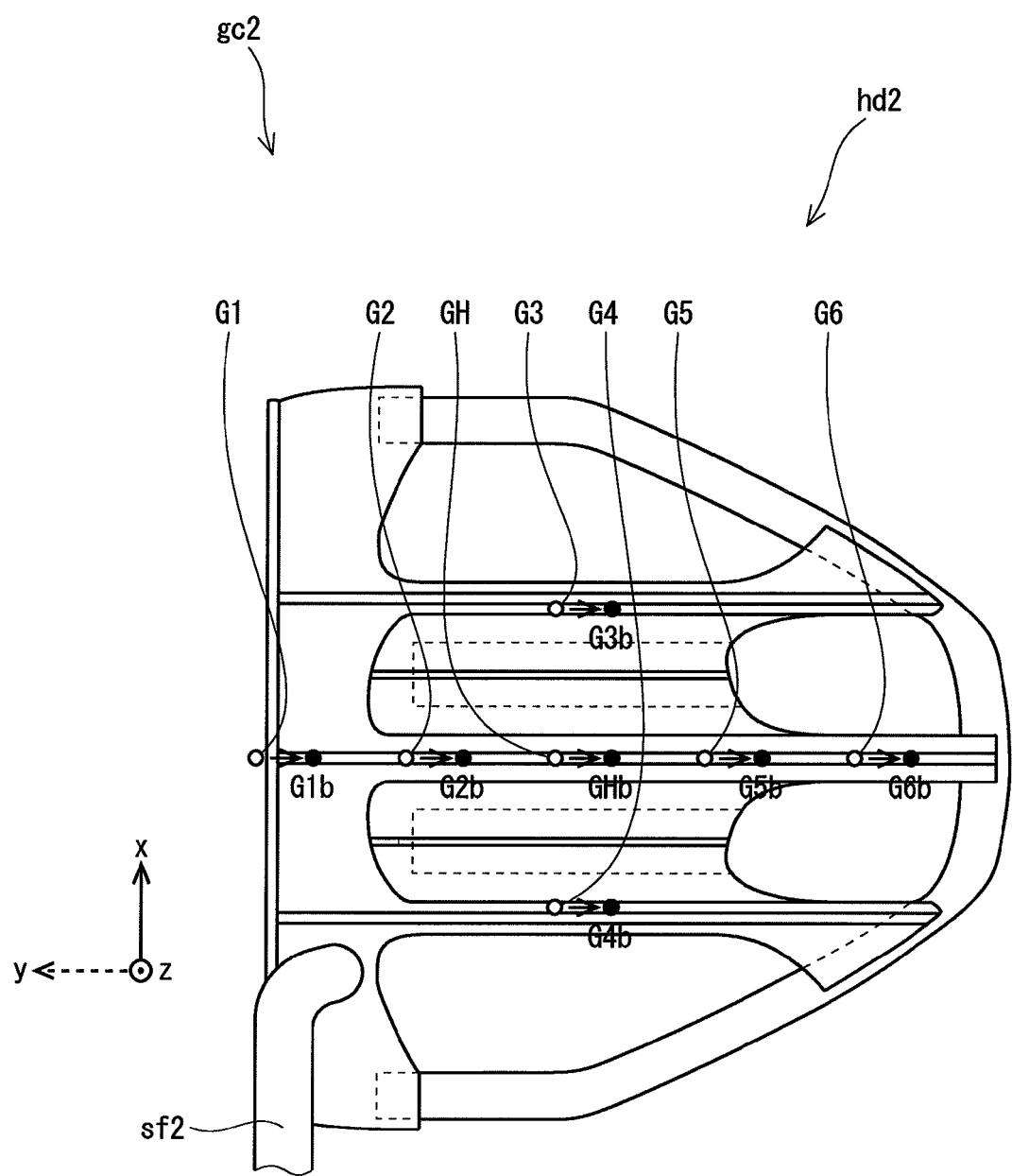
FIG. 10 is a view for explaining motion of a minute distance.

As shown in FIG. 8, in the evaluation of the position G1 of the center of gravity of the head, the position G1 of the center of gravity of the head, a position G1$a$ (see FIG. 8 or 9) of a center of gravity of the head located on a toe side by only a minute distance from the position G1 of the center of gravity of the head, and a position G1$b$ (see FIG. 8 or 10) of a center of gravity of the head located on a back side by only a minute distance from the position G2 of the center of gravity of the head were set.

The position of the center of gravity of the head was set to the position G1, and simulation was performed in the swing model G11 to obtain head information 11.

The position of the center of gravity of the head was set to the position G1$a$, and simulation was performed in the swing model G11 to obtain head information 11$a$.

The position of the center of gravity of the head was set to the position G1$b$, and simulation was performed in the swing model G11 to obtain head information 11$b$.

The position of the center of gravity of the head was set to the position G1, and simulation was performed in the swing model G12 to obtain head information 12.

The position of the center of gravity of the head was set to the position G1$a$, and simulation was performed in the swing model G12 to obtain head information 12$a$.

The position of the center of gravity of the head was set to the position G1$b$, and simulation was performed in the swing model G12 to obtain head information 12$b$.

As the head information, the face angle, the loft angle, the swing path angle, the blow angle, the toe-heel directional hitting point, and the vertical directional hitting point were employed. Sensitivity was calculated for each of these items.

Sensitivity between the position G1 of the center of gravity of the head and the position G1$a$ of the center of gravity of the head was calculated for each of the face angle, the loft angle, the swing path angle, the blow angle, the toe-heel directional hitting point, and the vertical directional hitting point.

Sensitivity between the position G1 of the center of gravity of the head and the position G1$b$ of the center of gravity of the head was calculated for each of the face angle, the loft angle, the swing path angle, the blow angle, the toe-heel directional hitting point, and the vertical directional hitting point.

Sensitivity $S_{1aF}$ of the face angle between the position G1 of the center of gravity of the head and the position G1$a$ of the center of gravity of the head was calculated by the following formula (1), formula (2) and formula (3).

$$S_{1aF} = \left|\frac{|\alpha_{1aF}| - |\beta_{1F}|}{dl}\right| \quad (1)$$

$$\alpha_{1aF} = \theta G_{1aF} - \theta B_{1aF} \quad (2)$$

$$\beta_{1F} = \theta G_{1F} - \theta B_{1F} \quad (3)$$

However, $\theta G_{1aF}$ is a face angle immediately before impact obtained by setting a position of a center of gravity of a head to G1a and performing simulation using the swing model G11. $\theta B_{1aF}$ is a face angle immediately before the impact obtained by setting a position of a center of gravity of a head to G1a and performing simulation using the swing model G12. $\theta G_{1F}$ is a face angle immediately before the impact obtained by setting a position of a center of gravity of a head to G1 and performing simulation using the swing model G11. $\theta B_{1F}$ is a face angle immediately before the impact obtained by setting a position of a center of gravity of a head to G1 and performing simulation using the swing model G12.

As a result, $S_{1aF}$ was calculated to be 2.87. $S_{1aF}$ is shown in a column of "$G_1$-$G_{1a}$" of a line of "$S_{aF}$" of the following Table 3.

Sensitivities for the positions G2, G3, G4, G5, G6, and GH of the centers of gravity were calculated as in the position G1 of the center of gravity. The moment of inertia (lateral moment of inertia) of the head was made the same for all the positions G1, G2, G3, G4, G5, G6, and GH of the centers of gravity.

Sensitivity $S_{2aF}$ of the face angle between the position G2 of the center of gravity of the head and the position G2a of the center of gravity of the head is shown by the following formula (4). The formula (4) corresponds to the formula (1).

$$S_{2aF} = \left|\frac{|\alpha_{2aF}| - |\beta_{2F}|}{dl}\right| \quad (4)$$

Sensitivity $S_{3aF}$ of the face angle between the position G3 of the center of gravity of the head and the position G3a of the center of gravity of the head is shown by the following formula (5). The formula (5) corresponds to the formula (1).

$$S_{3aF} = \left|\frac{|\alpha_{3aF}| - |\beta_{3F}|}{dl}\right| \quad (5)$$

Sensitivity $S_{4aF}$ of the face angle between the position G4 of the center of gravity of the head and the position G4a of the center of gravity of the head is shown by the following formula (6). The formula (6) corresponds to the formula (1).

$$S_{4aF} = \left|\frac{|\alpha_{4aF}| - |\beta_{4F}|}{dl}\right| \quad (6)$$

Sensitivity $S_{5aF}$ of the face angle between the position G5 of the center of gravity of the head and the position G5a of the center of gravity of the head is shown by the following formula (7). The formula (7) corresponds to the formula (1).

$$S_{5aF} = \left|\frac{|\alpha_{5aF}| - |\beta_{5F}|}{dl}\right| \quad (7)$$

Sensitivity $S_{6aF}$ of the face angle between the position G6 of the center of gravity of the head and the position G6a of the center of gravity of the head is shown by the following formula (8). The formula (8) corresponds to the formula (1).

$$S_{6aF} = \left|\frac{|\alpha_{6aF}| - |\beta_{6F}|}{dl}\right| \quad (8)$$

Sensitivity $S_{HaF}$ of the face angle between the position GH of the center of gravity of the head and the position GHa of the center of gravity of the head is shown by the following formula (9). The formula (9) corresponds to the formula (1).

$$S_{HaF} = \left|\frac{|\alpha_{HaF}| - |\beta_{HF}|}{dl}\right| \quad (9)$$

As these results, the sensitivity $S_{2aF}$ related to the position G2 of the center of gravity was calculated to be 12.65. The sensitivity $S_{2aF}$ is shown in a column of "$G_2$-$G_{2a}$" of the line of "$S_{aF}$" of the following Table 3.

Furthermore, the sensitivity $S_{3aF}$ related to the position G3 of the center of gravity was calculated to be 2703.10. The sensitivity $S_{3aF}$ is shown in a column of "$G_3$-$G_{3a}$" of the line of "$S_{aF}$" of the following Table 3.

Furthermore, the sensitivity $S_{4aF}$ related to the position G4 of the center of gravity was calculated to be 698.16. The sensitivity $S_{4aF}$ is shown in a column of "$G_4$-$G_{4a}$" of the line of "$S_{aF}$" of the following Table 3.

Furthermore, the sensitivity $S_{5aF}$ related to the position G5 of the center of gravity was calculated to be 524.65. The sensitivity $S_{5aF}$ is shown in a column of "$G_5$-$G_{5a}$" of the line of "$S_{aF}$" of the following Table 3.

Furthermore, the sensitivity $S_{6aF}$ related to the position G6 of the center of gravity was calculated to be 485.22. The sensitivity $S_{6aF}$ is shown in a column of "$G_6$-$G_{6a}$" of the line of "$S_{aF}$" of the following Table 3.

Furthermore, the sensitivity $S_{HaF}$ related to the position GH of the center of gravity was calculated to be 58.35. The sensitivity $S_{HaF}$ is shown in a column of "$G_H$-$G_{Ha}$" of the line of "$S_{aF}$" of the following Table 3.

Each of the sensitivity of the loft angle, the sensitivity of the swing path angle, the sensitivity of the blow angle, the sensitivity of the toe-heel directional hitting point, and the sensitivity of the vertical directional hitting point was calculated as in the sensitivity of the face angle.

Sensitivity $S_{1aL}$ of the loft angle related to the position G1 of the center of gravity is shown in a column of "$G_1$-$G_{1a}$" of the line of "$S_{aL}$" of the following Table 3. The sensitivity $S_{1aL}$ is calculated by the following formula (10). The formula (10) corresponds to the formula (1).

$$S_{1aL} = \left|\frac{|\alpha_{1aL}| - |\beta_{1L}|}{dl}\right| \quad (10)$$

Sensitivity $S_{2aL}$ of the loft angle related to the position G2 of the center of gravity is shown in a column of "$G_2$-$G_{2a}$" of the line of "$S_{aL}$" of the following Table 3. Sensitivity $S_{3aL}$ of the loft angle related to the position G3 of the center of gravity is shown in a column of "$G_3$-$G_{3a}$" of the line of "$S_{aL}$" of the following Table 3. Sensitivity $S_{4aL}$ of the loft angle related to the position G4 of the center of gravity is shown in a column of "$G_4$-$G_{4a}$" of the line of "$S_{aL}$" of the following Table 3. Sensitivity $S_{5aL}$ of the loft angle related to the position G5 of the center of gravity is shown in a column of "$G_5$-$G_{5a}$" of the line of "$S_{aL}$" of the following Table 3. Sensitivity $S_{6aL}$ of the loft angle related to the position G6 of the center of gravity is shown in a column of "$G_6$-$G_{6a}$" of the line of "$S_{aL}$" of the following Table 3. Sensitivity $S_{HaL}$ of the loft angle related to the position GH of the center of gravity is shown in a column of "$G_H$-$G_{Ha}$" of the line of "$S_{aL}$" of the following Table 3.

Sensitivity $S_{1aS}$ of the swing path angle related to the position G1 of the center of gravity is shown in a column of "$G_1$-$G_{1a}$" of a line of "$S_{aS}$" of the following Table 3. The sensitivity $S_{1aS}$ is calculated by the following formula (11). The formula (11) corresponds to the formula (1).

$$S_{1aS} = \left| \frac{|\alpha_{1aS}| - |\beta_{1S}|}{dl} \right| \quad (11)$$

Sensitivity $S_{2aS}$ of the swing path angle related to the position G2 of the center of gravity is shown in a column of "$G_2$-$G_{2a}$" of a line of "$S_{aS}$" of the following Table 3. Sensitivity $S_{3aS}$ of the swing path angle related to the position G3 of the center of gravity is shown in a column of "$G_3$-$G_{3a}$" of the line of "$S_{aS}$" of the following Table 3. Sensitivity $S_{4aS}$ of the swing path angle related to the position G4 of the center of gravity is shown in the column of "$G_4$-$G_{4a}$" of the line of "$S_{aS}$" of the following Table 3. Sensitivity $S_{5aS}$ of the swing path angle related to the position G5 of the center of gravity is shown in a column of "$G_6$-$G_{6a}$" of the line of "$S_{aS}$" of the following Table 3. Sensitivity $S_{6aS}$ of the swing path angle related to the position G6 of the center of gravity is shown in a column of "$G_6$-$G_{6a}$" of the line of "$S_{aS}$" of the following Table 3. Sensitivity $S_{HaS}$ of the swing path angle related to the position GH of the center of gravity is shown in a column of "$G_H$-$G_{Ha}$" of the line of "$S_{aS}$" of the following Table 3.

Sensitivity $S_{1aB}$ of the blow angle related to the position G1 of the center of gravity is shown in a column of "$G_1$-$G_{1a}$" of the line of "$S_{aB}$" of the following Table 3. The sensitivity $S_{1aB}$ is calculated by the following formula (12). The formula (12) corresponds to the formula (1).

$$S_{1aB} = \left| \frac{|\alpha_{1aB}| - |\beta_{1B}|}{dl} \right| \quad (12)$$

Sensitivity $S_{2aB}$ of the blow angle related to the position G2 of the center of gravity is shown in a column of "$G_2$-$G_{2a}$" of the line of "$S_{aB}$" of the following Table 3. Sensitivity $S_{3aB}$ of the blow angle related to the position G3 of the center of gravity is shown in a column of "$G_3$-$G_{3a}$" of the line of "$S_{aB}$" of the following Table 3. Sensitivity $S_{4aB}$ of the blow angle related to the position G4 of the center of gravity is shown in a column of "$G_4$-$G_{4a}$" of the line of "$S_{aB}$" of the following Table 3. Sensitivity $S_{5aB}$ of the blow angle related to the position G5 of the center of gravity is shown in the column of "$G_5$-$G_{5a}$" of the line of "$S_{aB}$" of the following Table 3. Sensitivity $S_{6aB}$ of the blow angle related to the position G6 of the center of gravity is shown in a column of "$G_6$-$G_{6a}$" of the line of "$S_{aB}$" of the following Table 3. Sensitivity $S_{HaB}$ of the blow angle related to the position GH of the center of gravity is shown in a column of "$G_H$-$G_{Ha}$" of the line of "$S_{aB}$" of the following Table 3.

Sensitivity $S_{1aY}$ of the toe-heel directional hitting point related to the position G1 of the center of gravity is shown in a column of "$G_1$-$G_{1a}$" of a line of "$S_{aY}$" of the following Table 3. The sensitivity $S_{1aY}$ is calculated by the following formula (13). The formula (13) corresponds to the formula (1).

$$S_{1aY} = \left| \frac{|\alpha_{1aY}| - |\beta_{1Y}|}{dl} \right| \quad (13)$$

Sensitivity $S_{2aY}$ of the toe-heel directional hitting point related to the position G2 of the center of gravity is shown in a column of "$G_2$-$G_{2a}$" of the line of "$S_{aY}$" of the following Table 3. Sensitivity $S_{3aY}$ of the toe-heel directional hitting point related to the position G3 of the center of gravity is shown in a column of "$G_3$-$G_{3a}$" of the line of "$S_{aY}$" of the following Table 3. Sensitivity $S_{4aY}$ of the toe-heel directional hitting point related to the position G4 of a center of gravity is shown in a column of "$G_4$-$G_{4a}$" of the line of "$S_{aY}$" of the following Table 3. Sensitivity $S_{5aY}$ of the toe-heel directional hitting point related to the position G5 of the center of gravity is shown in the column of "$G_5$-$G_{5a}$" of the line of "$S_{aY}$" of the following Table 3. Sensitivity $S_{HaY}$ of the toe-heel directional hitting point related to the position G6 of the center of gravity is shown in a column of "$G_6$-$G_{6a}$" of the line of "$S_{aY}$" of the following Table 3. Sensitivity $S_{HaY}$ of the toe-heel directional hitting point related to the position GH of the center of gravity is shown in a column of "$G_H$-$G_{Ha}$" of the line of "$S_{aY}$" of the following Table 3.

Sensitivity $S_{1aZ}$ of the vertical directional hitting point related to the position G1 of the center of gravity is shown in a column of "$G_1$-$G_{1a}$" of a line of "$S_{aZ}$" of the following Table 3. The sensitivity $S_{1aZ}$ is calculated by the following formula (14). The formula (14) corresponds to the formula (1).

$$S_{1aZ} = \left| \frac{|\alpha_{1aZ}| - |\beta_{1Z}|}{dl} \right| \quad (14)$$

Sensitivity $S_{2aZ}$ of the vertical directional hitting point related to the position G2 of the center of gravity is shown in a column of "$G_2$-$G_{2a}$" of the line of "$S_{aZ}$" of the following Table 3. Sensitivity $S_{3aZ}$ of the vertical directional hitting point related to the position G3 of the center of gravity is shown in a column of "$G_3$-$G_{3a}$" of the line of "$S_{aZ}$" of the following Table 3. Sensitivity $S_{4aZ}$ of the vertical directional hitting point related to the position G4 of the center of gravity is shown in a column of "$G_4$-$G_{4a}$" of the line of "$S_{aZ}$" of the following Table 3. Sensitivity $S_{5aZ}$ of the vertical directional hitting point related to the position G5 of the center of gravity is shown in a column of "$G_5$-$G_{5a}$" of the line of "$S_{aZ}$" of the following Table 3. Sensitivity $S_{6aZ}$ of the vertical directional hitting point related to the position G6 of the center of gravity is shown in a column of "$G_6$-$G_{6a}$" of the line of "$S_{aZ}$" of the following Table 3. Sensitivity $S_{HaZ}$ of the vertical directional hitting point related to the position GH of the center of gravity is shown in a column of "$G_H$-$G_{Ha}$" of the line of "$S_{aZ}$" of the following Table 3.

TABLE 3

Sensitivity of each of positions of centers of gravity when being moved by minute distance in toe-heel direction (use of two swing data by identical person, golf club gc2)

| | $G_1$-$G_{1a}$ | $G_2$-$G_{2a}$ | $G_3$-$G_{3a}$ | $G_4$-$G_{4a}$ | $G_5$-$G_{5a}$ | $G_6$-$G_{6a}$ | $G_H$-$G_{Ha}$ |
|---|---|---|---|---|---|---|---|
| $S_{aF}$ | 2.87 | 12.65 | 2703.10 | 698.16 | 524.65 | 485.22 | 58.35 |
| $S_{aL}$ | 1.18 | 7.41 | 1452.05 | 264.11 | 233.80 | 127.36 | 28.54 |
| $S_{aS}$ | 0.003 | 0.03 | 595.28 | 691.17 | 19.72 | 79.49 | 2.47 |
| $S_{aB}$ | 0.01 | 0.02 | 197.45 | 221.57 | 12.56 | 92.79 | 1.61 |
| $S_{aY}$ | 0.01 | 0.35 | 5770.37 | 6013.10 | 46.57 | 155.82 | 2.61 |
| $S_{aZ}$ | 0.06 | 0.25 | 4380.92 | 4137.59 | 26.35 | 234.38 | 1.65 |

Example 2

Sensitivity of example 2 was calculated in the same manner as in the example 1 except that the position to be moved was changed to the position G1b of the center of gravity of the head from the position G1a of the center of gravity of the head. The sensitivity is shown in the following Table 4. The notation rule of Table 4 is the same as that of Table 3.

TABLE 4

Sensitivity of each of positions of centers of gravity when being moved by minute distance in face-back direction
(use of two swing data by identical person, golf club gc2)

|  | $G_1$-$G_{1b}$ | $G_2$-$G_{2b}$ | $G_3$-$G_{3b}$ | $G_4$-$G_{4b}$ | $G_5$-$G_{5b}$ | $G_6$-$G_{6b}$ | $G_H$-$G_{Hb}$ |
|---|---|---|---|---|---|---|---|
| $S_{bF}$ | 2.40 | 19.31 | 1036.12 | 729.59 | 810.12 | 2291.22 | 80.93 |
| $S_{bL}$ | 0.70 | 11.66 | 777.41 | 279.83 | 422.26 | 1213.63 | 39.45 |
| $S_{bS}$ | 0.01 | 0.03 | 652.12 | 691.53 | 25.66 | 71.96 | 3.71 |
| $S_{bB}$ | 0.01 | 0.04 | 217.78 | 221.83 | 16.97 | 49.82 | 2.45 |
| $S_{bY}$ | 0.11 | 0.51 | 5771.45 | 6013.70 | 62.09 | 235.45 | 3.18 |
| $S_{bZ}$ | 0.08 | 0.16 | 4424.43 | 4137.79 | 34.22 | 116.40 | 2.30 |

From the results of Tables 3 and 4, it was found that the sensitivity at the position G1 of the center of gravity is smaller than the sensitivity of the other the position of the center of gravity. Under a condition where the moment of inertia is the same, it is presumed that so the position of the center of gravity is closer to (an extended line of) a shaft axial line, the stability is higher.

Example 3

In the example 1, the swing data 1 (good swing) and the swing data 2 (poor swing) were used. On the other hand, only the swing data 1 was used in example 3. Sensitivity at each of the positions of the centers of gravity was calculated in the same manner as in the example 1 except that only the swing data 1 was used.

Therefore, in the example 3, the $\theta G_{1aF}$ was used in place of the $\alpha_{1aF}$, and the $\theta G_{1F}$ was used in replace of the $\beta_{1F}$. In the example 3, sensitivity $S_{1aF}$ of the position G1 of the center of gravity in consideration of the case where the position of the center of gravity was moved by only a minute distance d1 and is set to $G_{1a}$ is shown by the following formula (15). The formula (15) corresponds to the formula (1) in the example 1. The sensitivity $S_{1aF}$ is shown in a column of "$G_1$-$G_{1a}$" of a line of "$S_{aF}$" of the following Table 5.

$$S_{1aF}=|\theta G_{1aF}-\theta G_{1F}|/|d1| \quad (15)$$

For the other positions G2, G3, G4, G5, G6, and GH of the centers of gravity, the sensitivity of each of the positions of the centers of gravity related to a face angle, that is, sensitivity $S_{2aF}$, sensitivity $S_{3aF}$, sensitivity $S_{4aF}$, sensitivity $S_{5aF}$, sensitivity $S_{6aF}$, and sensitivity $S_{HaF}$ were obtained in the same manner as in the case of G1. The sensitivity $S_{2aF}$ in the example 3 is shown in a column of "$G_2$-$G_{2a}$" of the line of "$S_{aF}$" of the following Table 5. Similarly, the sensitivity $S_{3aF}$ in the example 3 is shown in a column of "$G_3$-$G_{3a}$" of the line of "$S_{aF}$" of the following Table 5. Similarly, the sensitivity $S_{4aF}$ in the example 3 is shown in a column of "$G_4$-$G_{4a}$" of the line of "$S_{aF}$" of the following Table 5. Similarly, the sensitivity $S_{5aF}$ in the example 3 is shown in a column of "$G_5$-$G_{5a}$" of the line of "$S_{aF}$" of the following Table 5. Similarly, the sensitivity $S_{6aF}$ in the example 3 is shown in a column of "$G_6$-$G_{6a}$" of the line of "$S_{aF}$" of the following Table 5. Similarly, the sensitivity $S_{HaF}$ in the example 3 is shown in a column of "$G_H$-$G_{Ha}$" of the line of "$S_{aF}$" of the following Table 5.

The sensitivity of each of the positions of the centers of gravity related to the loft angle, that is, the sensitivity $S_{1aL}$, the sensitivity $S_{2aL}$, the sensitivity $S_{3aL}$, the sensitivity $S_{4aL}$, the sensitivity $S_{5aL}$, the sensitivity $S_{6aL}$, and the sensitivity $S_{HaF}$ were obtained in the same as that of the sensitivity of the face angle except that the head information was changed to the loft angle. For the loft angle, the sensitivity $S_{1aL}$ of the position G1 in the example 3 is shown in a column of "$G_1$-$G_{1a}$" of a line of "$S_{aL}$" of the following Table 5. For the loft angle, the sensitivity $S_{2aL}$ of the position G2 in the example 3 is shown in a column of "$G_2$-$G_{2a}$" of the line of "$S_{aL}$" of the following Table 5. For the loft angle, the sensitivity $S_{3aL}$ of the position G3 in the example 3 is shown in a column of "$G_3$-$G_{3a}$" of the line of "$S_{aL}$" of the following Table 5. For the loft angle, the sensitivity $S_{4aL}$ of the position G4 in the example 3 is shown in a column of "$G_4$-$G_{4a}$" of the line of "$S_{aL}$" of the following table 5. For the loft angle, the sensitivity $S_{5aL}$ of the position G5 in the example 3 is shown in a column of "$G_5$-$G_{5a}$" of the line of "$S_{aL}$" of the following Table 5. For the loft angle, the sensitivity $S_{6aL}$ of the position G6 in the example 3 is shown in a column of "$G_6$-$G_{6a}$" of the line of "$S_{aL}$" of the following Table 5. For the loft angle, the sensitivity $S_{HaL}$ of the position GH in the example 3 is shown in a column of "$G_H$-$G_{Ha}$" of the line of "$S_{aL}$" of the following Table 5.

Sensitivities for the swing path angle, the blow angle, the toe-heel directional hitting point position, and the vertical directional hitting point position were also calculated in the same manner as in the example 1. The calculated result of the sensitivity of the swing path angle is shown in a line of "$S_{aS}$" of the following Table 5. The calculated result of the sensitivity of the blow angle is shown in a line of "$S_{aB}$" of the following Table 5. The calculated result of the sensitivity of the toe-heel directional hitting point position is shown in a line of "$S_{aY}$" of the following Table 5. The calculated result of the sensitivity of the vertical directional hitting point position is shown in a line of "$S_{aZ}$" of the following Table 5.

TABLE 5

Sensitivity of each of positions of centers of gravity when being moved by minute distance in toe-heel direction
(use of one swing data: swing providing good result, golf club gc2)

|  | $G_1$-$G_{1a}$ | $G_2$-$G_{2a}$ | $G_3$-$G_{3a}$ | $G_4$-$G_{4a}$ | $G_5$-$G_{5a}$ | $G_6$-$G_{6a}$ | $G_H$-$G_{Ha}$ |
|---|---|---|---|---|---|---|---|
| $S_{aF}$ | 23.16 | 15.71 | 2295.72 | 27.31 | 1146.40 | 2894.43 | 258.09 |
| $S_{aL}$ | 11.55 | 8.38 | 1261.98 | 13.67 | 589.75 | 1510.56 | 130.09 |
| $S_{aS}$ | 0.021 | 0.15 | 42.50 | 0.27 | 25.24 | 79.43 | 5.04 |
| $S_{aB}$ | 0.003 | 0.22 | 15.53 | 0.05 | 17.55 | 53.73 | 3.68 |
| $S_{aY}$ | 0.82 | 0.49 | 56.48 | 1.10 | 100.30 | 374.67 | 12.40 |
| $S_{aZ}$ | 0.60 | 0.09 | 59.29 | 0.62 | 52.57 | 193.57 | 7.15 |

Example 4

Sensitivity of example 4 was calculated in the same manner as in the example 3 except that the position to be moved was changed to the position G1b of the center of gravity of the head from the position G1a of the center of gravity of the head. The sensitivity is shown in the following Table 6. The notation rule of Table 6 is the same as that of Table 5.

TABLE 6

Sensitivity of each of positions of centers of gravity when being
moved by minute distance in face-back direction
(use of one swing data: swing providing good result, golf club gc2)

|  | $G_1$-$G_{1b}$ | $G_2$-$G_{2b}$ | $G_3$-$G_{3b}$ | $G_4$-$G_{4b}$ | $G_5$-$G_{5b}$ | $G_6$-$G_{6b}$ | $G_H$-$G_{Hb}$ |
|---|---|---|---|---|---|---|---|
| $S_{bF}$ | 44.68 | 43.13 | 3108.85 | 40.05 | 2170.74 | 4868.36 | 511.84 |
| $S_{bL}$ | 22.24 | 22.61 | 1626.75 | 20.05 | 674.41 | 2107.29 | 186.13 |
| $S_{bS}$ | 0.08 | 0.30 | 100.81 | 0.39 | 42.49 | 98.52 | 9.81 |
| $S_{bB}$ | 0.02 | 0.42 | 45.51 | 0.11 | 30.81 | 74.45 | 7.24 |
| $S_{bY}$ | 0.50 | 2.43 | 152.03 | 0.39 | 178.78 | 566.80 | 22.63 |
| $S_{bZ}$ | 0.40 | 0.79 | 135.81 | 0.21 | 91.99 | 280.46 | 12.88 |

Example 5

Sensitivity of each of the positions of the centers of gravity was calculated in the same manner as in the example 3 except that the swing data 2 (poor swing) was used in place of the swing data 1 (good swing). The results are shown in the following Table 7.

TABLE 7

Sensitivity of each of positions of centers of gravity when being
moved by minute distance in toe-heel direction
(use of one swing data: swing providing poor result, golf club gc2)

|  | $G_1$-$G_{1a}$ | $G_2$-$G_{2a}$ | $G_3$-$G_{3a}$ | $G_4$-$G_{4a}$ | $G_5$-$G_{5a}$ | $G_6$-$G_{6a}$ | $G_H$-$G_{Ha}$ |
|---|---|---|---|---|---|---|---|
| $S_{aF}$ | 20.29 | 28.36 | 4998.82 | 670.84 | 1671.04 | 4484.00 | 316.44 |
| $S_{aL}$ | 10.37 | 15.79 | 2714.04 | 250.45 | 800.11 | 2081.92 | 97.82 |
| $S_{aS}$ | 0.018 | 0.18 | 552.79 | 691.44 | 44.95 | 158.92 | 7.51 |
| $S_{aB}$ | 0.01 | 0.24 | 181.92 | 221.52 | 30.11 | 39.06 | 5.29 |
| $S_{aY}$ | 0.83 | 0.84 | 5713.88 | 6012.00 | 146.87 | 218.85 | 15.01 |
| $S_{aZ}$ | 0.54 | 0.16 | 4321.63 | 1474.69 | 78.92 | 427.94 | 8.79 |

Example 6

Sensitivity of each of the positions of the centers of gravity was calculated in the same manner as in the example 4 except that the swing data 2 (poor swing) was used in place of the swing data 1 (good swing). The results are shown in the following Table 8.

TABLE 8

Sensitivity of each of positions of centers of gravity when being
moved by minute distance in face-back direction
(use of one swing data: swing providing poor result, golf club gc2)

|  | $G_1$-$G_{1b}$ | $G_2$-$G_{2b}$ | $G_3$-$G_{3b}$ | $G_4$-$G_{4b}$ | $G_5$-$G_{5b}$ | $G_6$-$G_{6b}$ | $G_H$-$G_{Hb}$ |
|---|---|---|---|---|---|---|---|
| $S_{bF}$ | 42.28 | 62.44 | 4145.02 | 769.64 | 2980.86 | 7159.58 | 592.77 |
| $S_{bL}$ | 21.54 | 26.54 | 2404.15 | 299.88 | 1540.83 | 3764.91 | 297.55 |
| $S_{bS}$ | 0.07 | 0.32 | 752.92 | 691.14 | 68.14 | 170.49 | 13.52 |
| $S_{bB}$ | 0.04 | 0.46 | 263.29 | 221.95 | 47.78 | 124.28 | 9.69 |
| $S_{bY}$ | 0.40 | 2.94 | 5923.48 | 6014.09 | 240.87 | 802.25 | 25.81 |
| $S_{bZ}$ | 0.48 | 0.95 | 4560.24 | 1473.67 | 126.21 | 396.86 | 15.18 |

Also from the results of Tables 5 to 8, it is presumed that so the position of the center of gravity is closer to (an extended line of) a shaft axial line, the stability is higher.

Example 7

Sensitivity of each of the head information was calculated in the same manner as in the example 5 except that the golf club gc3 was used in place of the golf club gc2. The results are shown in the following Table 9. The positions G1 to G6 and the position GH were set as shown in FIG. 11. The distance between the positions was set to 20 mm in the golf club gc2. However, a distance between the positions was set to 15 mm in golf club gc3.

TABLE 9

Sensitivity of each of positions of centers of gravity when
being moved by minute distance in toe-heel direction
(use of one swing data: swing providing poor result, golf club gc3)

|  | $G_1$-$G_{1a}$ | $G_2$-$G_{2a}$ | $G_3$-$G_{3a}$ | $G_4$-$G_{4a}$ | $G_H$-$G_{Ha}$ |
|---|---|---|---|---|---|
| $S_{aF}$ | 854.70 | 94746.33 | 100.83 | 4432.08 | 3853.00 |
| $S_{aL}$ | 70.21 | 52216.17 | 51.28 | 2141.62 | 1737.30 |
| $S_{aS}$ | 91.75 | 5708.07 | 7.12 | 298.66 | 283.96 |
| $S_{aB}$ | 52.10 | 1958.31 | 4.30 | 66.97 | 30.10 |
| $S_{aY}$ | 256.29 | 6757.49 | 21.94 | 1026.20 | 635.18 |
| $S_{aZ}$ | 132.70 | 4365.10 | 10.30 | 552.73 | 273.28 |

Example 8

Sensitivity of each of the head information was calculated in the same manner as in the example 6 except that the golf club gc3 was used in place of the golf club gc2. The results are shown in the following Table 10.

TABLE 10

Sensitivity of each of positions of centers of gravity when
being moved by minute distance in face-back direction
(use of one swing data: swing providing poor result, golf club gc3)

|  | $G_1$-$G_{1b}$ | $G_2$-$G_{2b}$ | $G_3$-$G_{3b}$ | $G_4$-$G_{4b}$ | $G_H$-$G_{Hb}$ |
|---|---|---|---|---|---|
| $S_{bF}$ | 1361.15 | 73983.69 | 79.17 | 7303.20 | 6898.07 |
| $S_{bL}$ | 12.48 | 76788.43 | 40.27 | 4052.23 | 3679.21 |
| $S_{bS}$ | 141.27 | 915.69 | 5.19 | 574.68 | 573.52 |
| $S_{bB}$ | 299.03 | 493.10 | 3.16 | 385.42 | 341.31 |
| $S_{bY}$ | 659.63 | 10859.53 | 16.30 | 465.62 | 1739.12 |
| $S_{bZ}$ | 794.83 | 6762.72 | 7.54 | 1259.35 | 883.45 |

The simulations of the different golf clubs are performed in the same swing (the swing data 2) and the same position of the center of gravity in the examples 5 and 7. The comparison of the example 5 with the example 7 can indicate the influence of the moment of inertia of the head. The moment of inertia is described in Tables 1 and 2 described above. When Table 7 is compared with Table 9, Table 7 (example 5) tends to have sensitivity smaller than that of Table 9 (example 7). From the result, it is presumed that a larger moment of inertia provides higher stability.

The simulations of the different golf clubs are performed in the same swing (the swing data 2) and the same position of the center of gravity in the examples 6 and 8. The comparison of the example 6 with the example 8 can indicate the influence of the moment of inertia of the head. When Table 8 is compared with Table 10, Table 8 (example 6) tends to have sensitivity smaller than that of Table 10 (example 8). From the result, it is presumed that a larger moment of inertia provides higher stability.

In the examples, the stability was determined according to the sensitivity. However, the basis of the stability is not limited to the sensitivity. For example, the stability is presumed according to an absolute value $|\theta G_{1aF} - \theta G_{1F}|$ or the like. If the simulation determines that fluctuation in the specification is smaller, it can be presumed that the stability is higher.

In the examples, the swing model based on the actual measurement was corrected, and the swing model (for example, the swing model G11 and the swing model G12 or the like) for each of the positions of the centers of gravity was made. The swing model may not be corrected. The swing model based on the actual measurement may be used without change.

From the results, it was found that so the moment of inertia of the head is larger and the position of the center of gravity is closer to (the extended line of) the shaft axial line, the stability is more excellent. The moment of inertia of the head is not limited. For example, the Ixx, the Iyy, and the Izz are exemplified as the moment of inertia of the head.

It was found that for the moment of inertia, the lateral moment of inertia (the Izz) particularly tends to contribute to the stability.

In respect of the stability, the lateral moment of inertia of the head are preferably equal to or greater than 5000 g·cm$^2$, more preferably equal to or greater than 5500 g·cm$^2$, and still more preferably equal to or greater than 6000 g·cm$^2$. As the lateral moment of inertia is larger, the stability is more excellent. When a weight of the head is equal to or less than 380 g, it is considered that the lateral moment of inertia of the head which can be produced are equal to or less than about 8000 g·cm$^2$.

In respect of the stability, the depth of the center of gravity of the head is preferably equal to or less than 18 mm, more preferably equal to or less than 15 mm, and still more preferably equal to or less than 13 mm. As the depth of the center of gravity is smaller, the stability is more excellent. When the thickness of the head is excessively small, unpleasant vibration may be caused. In this respect, the depth of the center of gravity of the head is preferably equal to or greater than 0 mm.

As described also in Japanese Patent 2007-307353 described above, in the conventional head, the lateral moment of inertia and the depth of the center of gravity were increased in order to improve hitting directivity when hitting at the position separated from the center of gravity of the head (sweet spot). In this case, the head was extended backward to enlarge the longitudinal width of the head. The design increased the depth of the center of gravity with the increase of the lateral moment of inertia. Conventionally, a great lateral moment of inertia and a great depth of a center of gravity were considered to suppress deviation of a hitting ball. On the other hand, the finding of the present invention is different from the technical effect of the conventional technique. The finding of the present invention goes against the conventional technical general knowledge. The details of the reason are unknown. A novel technical thought was found by the simulation. There was clarified the novel technical thought that the analysis using the link model increases the lateral moment of inertia and reduces the depth of the center of gravity.

The lateral moment of inertia is Izz in Tables 1 and 2 described above. That is, the lateral moment of inertia is the moment of inertia around the z axis in the local coordinate system LS1 of the head.

The lateral moment of inertia may be calculated from three-dimensional data, and may actually be measured. For example, MOMENT OF INERTIA MEASURING INSTRUMENT MODEL NO. 005-002 manufactured by INERTIA DYNAMICS INC. can be used as a measuring instrument in the case of actual measurement. The lateral moment of inertia is a moment of inertia around an axis extending in a vertical direction and passing through a center of gravity. The axis passes through a center of gravity of a head having a standard state where the head is placed on a level surface at a predetermined lie angle and real loft angle and extends in a vertical direction.

The depth of the center of gravity is measured along the y axis in the local coordinate system LS1. The depth of the center of gravity is a y-axial direction distance between the foremost point of the head and the center of gravity of the head. The foremost point of the head is a point of which a y coordinate is the maximum. Typically, the foremost point of the head exists on a leading edge. The y axis of the local coordinate system LS1 is parallel to a standard plane. The standard plane means a level surface h in a standard state where a head is placed on the level surface h at a predetermined lie angle and real loft angle. The predetermined lie angle and real loft angle are set for each of varieties of the golf club. The predetermined lie angle and real loft angle are contained in, for example, product catalogs. The z axis of the local coordinate system LS1 is perpendicular to the standard plane. The x axis of the local coordinate system LS1 is parallel to the face surface of the head.

Example 9

Figure 12:
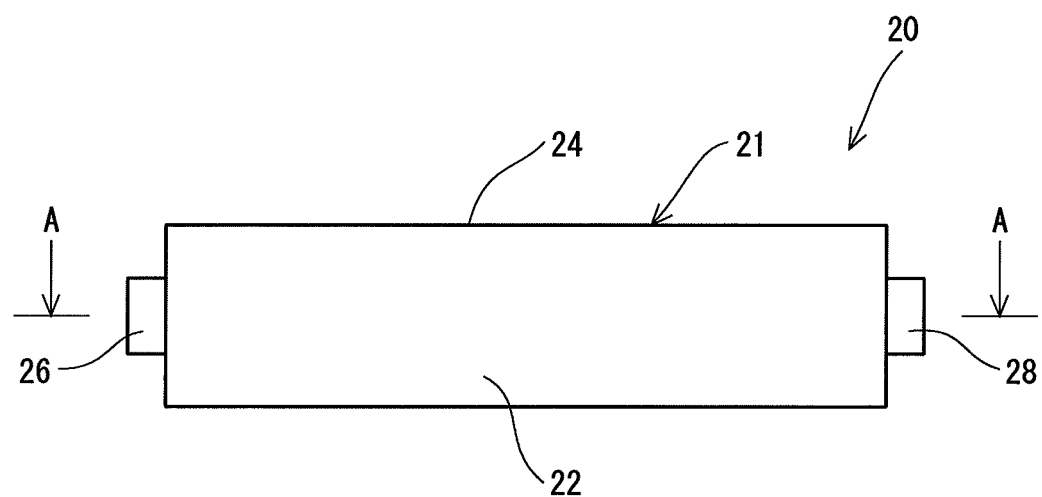
FIG. 12 is a front view showing another example of a head according to the present invention.
Figure 13:
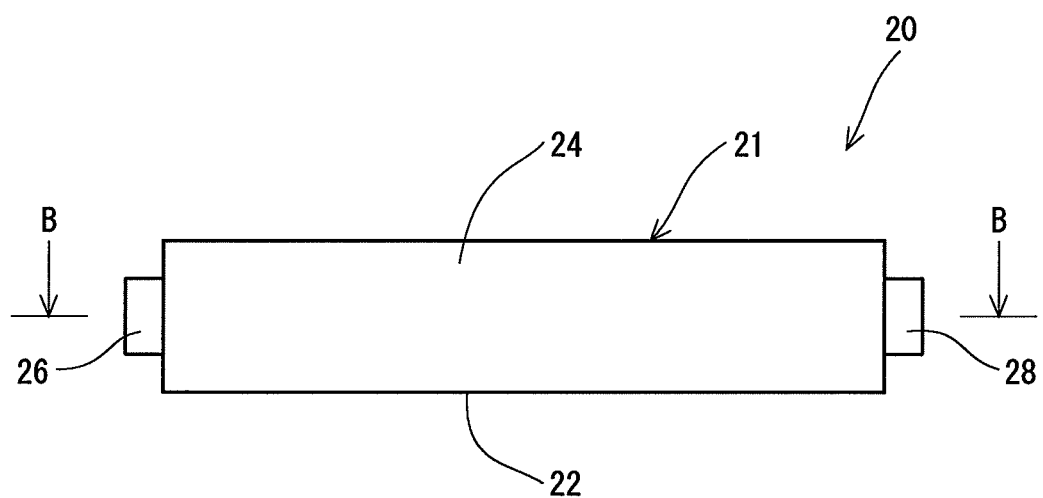
FIG. 13 is a top view showing another examples of the head according to the present invention.
Figure 14:
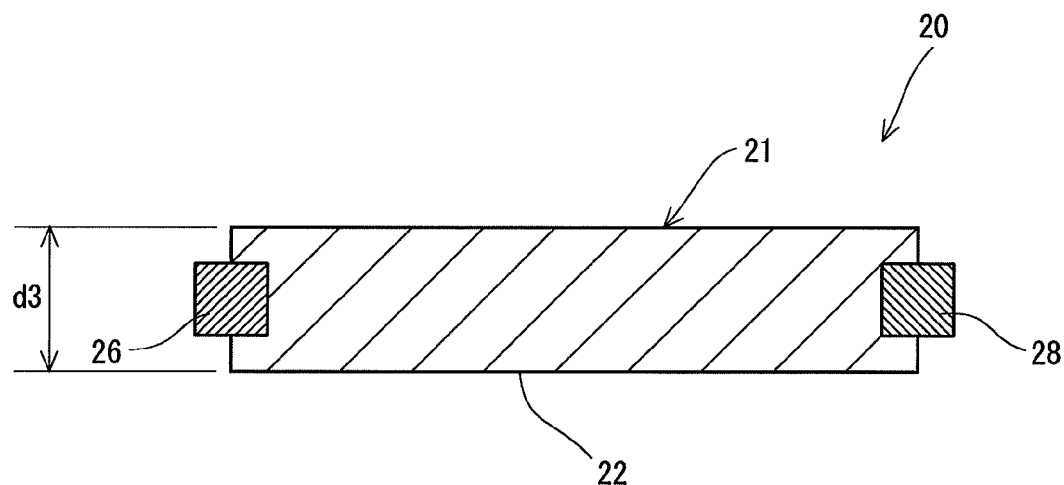
FIG. 14 is a cross sectional view taken along a line A-A of FIG. 12.
Figure 15:
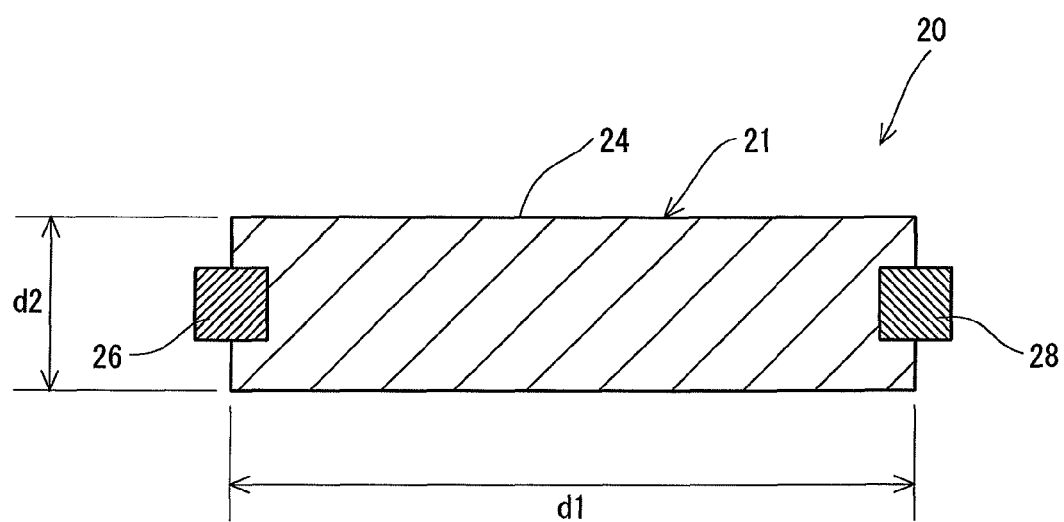
FIG. 15 is a cross sectional view taken along a line B-B of FIG. 13.

FIG. 12 is a view of a golf club head 20 for a putter, as viewed from a face side. FIG. 13 is a view of the head 20, as viewed from above. FIG. 14 is a cross sectional view taken along the line A-A of FIG. 12. FIG. 15 is a cross sectional view taken along the line B-B of FIG. 13. The head 20 has a head body 21, a toe side weight 26, and a heel side weight 28. The head body 21 has a face surface 22 and top surface 24. The head body 21 is an almost rectangular parallelepiped.

As described above, the head having excellent stability can be obtained by increasing the lateral moment of inertia and locating the center of gravity of the head closer to (the extended line of) the shaft axial line. The distance between the center of gravity of the head and (the extended line of) the shaft axial line is also referred to as a distance of a center of gravity. The depth of the center of gravity is a front-back directional distance between the front end of the head and the center of gravity, and correlates with the distance of the center of gravity.

In order to increase the lateral moment of inertia without increasing the depth of the center of gravity (the distance of the center of gravity), for example, the following design 1, design 2, design 3, and design 4 can be employed.
(Design 1): A toe-heel directional length of the head is lengthened.
(Design 2): A face-back directional length of the head is shortened.
(Design 3): A metal having high specific gravity is disposed nearer to a toe side and/or a heel side.
(Design 4): A hollow part or a metal having low specific gravity is provided near the extended line of the shaft axial line.

The head having excellent stability can be materialized by, for example, heads such as the head 20. In the head 20, a toe-heel directional length d1 of the head body part is increased, and a face-back directional length d3 thereof is decreased. Furthermore, a toe side weight 26 and a heel side weight 28 are disposed. The specific gravities of the toe side weight 26 and the heel side weight 28 are larger than the specific gravity of the head body 21. Even when the toe side weight 26 and the heel side weight 28 are not provided, the lateral moment of inertia can be increased by further increasing the toe-heel directional length d1.

FIG. 16 shows a graph (scatter graph) in which a large number of heads obtained by changing the following specifications in the head 20 are plotted.
(Specification 1) a toe-heel directional length d1 of a head body part
(Specification 2) a face height d2
(Specification 3) a face-back directional length d3

(Specification 4) specific gravities of a toe side weight 26 and a heel side weight 28
(Specification 5) positions of the toe side weight 26 and the heel side weight 28
(Specification 6) specific gravity of a head body
(Specification 7) existence or nonexistence and volume of a hollow part provided on the head body
(Specification 8) existence or nonexistence and position of the hollow part provided on the head body In FIG. 16, a vertical axis is a lateral moment of inertia (g·cm$^2$), and a horizontal axis is a depth of a center of gravity (mm).

A head weight of the head shown in FIG. 16 was set to 320 g or greater and 380 g or less. The weight range was set in consideration of the weight of the putter head capable of being actually used.

The data of the golf club gc2 and the golf club gc3 are further added to FIG. 16. In the graph of FIG. 16, the data of the golf club gc2 is shown by a white triangle. In the graph of FIG. 16, the data of the golf club gc3 is shown by a white square.

A particularly preferable example of the head is shown by a black circle in FIG. 16. The head was made by adjusting a size or the like in the head 20. Specifically, the toe-heel directional length d1 was set to 100 mm; the face height d2 was set to 25 mm; the face-back directional length d3 was set to 22 mm; the weight of the toe side weight 26 was set to 100 g; the weight of the heel side weight 28 was set to 100 g; and the weight of the head body was set to 150 g. An aluminium alloy was used as the material of the head body. A tungsten alloy was used as the material of the toe side weight 26 and the heel side weight 28. In the head, the lateral moment of inertia was 6310 g·cm$^2$; the depth of the center of gravity was 11 mm; and the weight of the head was 350 g. The head has excellent stability.

The present invention presents the novel designing method for estimating the stability using the simulation. The designing method revealed that the head different from the conventional one can enhance the stability. The finding is different from the conventional technical general knowledge.

The method explained above can be applied to all the golf clubs.

The description hereinabove is merely for an illustrative example, and various modifications can be made in the scope not to depart from the principles of the present invention.

What is claimed is:

1. A method for designing a golf club comprising the steps of:
   measuring a golf swing to obtain a measured result;
   obtaining a swing model provided with a link model and joint torque data based on the measured result, the link model having at least two links;
   performing simulation for swing the golf club using the swing model; and
   obtaining head information in a specific situation during a swing based on a result of the simulation,
   wherein the link model includes a link corresponding to a part of a swing subject and a link corresponding to at least a part of the golf club;
   a plurality of specifications of the golf club and/or the plurality of swing models are used to obtain the plurality of head information; and
   stability is evaluated based on the head information,
   wherein the plurality of specifications of the golf club is used to obtain the plurality of head information, and wherein the stability is evaluated based on sensitivity obtained by dividing a difference between the head information by a difference between the specifications.

2. The method according to claim 1, wherein a part of the swing subject is a region between a neck part of a human body and a hand part thereof.

3. The method according to claim 1, wherein the head information is a head speed, a locus of head, a hitting point or a face angle, and
   wherein the specific situation is immediately before impact.

4. The method according to claim 1, wherein the head information for calculating the sensitivity is a head speed, a locus of head, a hitting point, or a face angle.

5. The method according to claim 1, wherein the specifications for calculating the sensitivity are a position of a center of gravity of a head and/or a moment of inertia of the head.

6. The method according to claim 3, wherein the locus of head is a blow angle or swing path angle.

7. A method according to claim 1, wherein a swing model is used.

8. A method according to claim 1, wherein a plurality of swing models by the same person is used.

9. A golf club designed by the method of claim 1.

10. A golf club having a position of a center of gravity of a head and/or a moment of inertia of the head designed by the method of claim 5.

11. The golf club according to claim 10, wherein a lateral moment of inertia of the head is equal to or greater than 5000 g·cm$^2$, and
    wherein a depth of a center of gravity of the head is equal to or less than 18 mm.

12. A method for designing a golf club comprising the steps of:
    measuring a golf swing to obtain a measured result;
    obtaining a first swing model provided with a link model based on the measured result, the link model having at least two links;
    performing simulation for a first swing of a golf club with a first specification using the first swing model;
    measuring head information during a first swing;
    performing simulation for a second swing of a golf club with a second specification using the first swing model;
    measuring head information during a second swing; and
    calculating sensitivity by dividing a difference between the head information of the first swing and the second swing by a difference between the first and second specifications.

13. The method according to claim 12, wherein the head information is a head speed, a locus of head, a hitting point, or a face angle.

14. The method according to claim 12, wherein the first and second specifications are a position of a center of gravity of a head or a moment of inertia of the head.

15. The method according to claim 12, further comprising:
    obtaining a second swing model provided with a link model based on the measured result, the link model having at least two links;
    performing simulation for a third swing of a golf club with the first specification using the second swing model;
    measuring head information during a third swing;
    performing simulation for a fourth swing of a golf club with the second specification using the second swing model;
    measuring head information during a fourth swing; and
    calculating sensitivity by:

calculating a first difference between the head information of the first swing and third swing;
calculating a second difference between the head information of the second swing and fourth swing,
calculating a third difference between the first difference and the second difference; and
dividing the third difference by a difference between the first and second specifications.

\* \* \* \* \*